United States Patent
Matheja et al.

(10) Patent No.: US 10,536,773 B2
(45) Date of Patent: Jan. 14, 2020

(54) METHODS AND APPARATUS FOR SELECTIVE MICROPHONE SIGNAL COMBINING

(71) Applicant: NUANCE COMMUNICATIONS, INC., Burlington, MA (US)

(72) Inventors: Timo Matheja, Ulm (DE); Markus Buck, Biberach (DE); Julien Premont, Ulm (DE)

(73) Assignee: Cerence Operating Company, Burlington, MA (US)

( * ) Notice: Subject to any disclaimer, the term of this patent is extended or adjusted under 35 U.S.C. 154(b) by 0 days.

(21) Appl. No.: 15/029,330

(22) PCT Filed: Oct. 30, 2013

(86) PCT No.: PCT/US2013/067464
§ 371 (c)(1),
(2) Date: Apr. 14, 2016

(87) PCT Pub. No.: WO2015/065362
PCT Pub. Date: May 7, 2015

(65) Prior Publication Data
US 2016/0261951 A1    Sep. 8, 2016

(51) Int. Cl.
*H04R 3/00* (2006.01)
*H04R 5/027* (2006.01)
(Continued)

(52) U.S. Cl.
CPC .......... *H04R 3/005* (2013.01); *G10L 21/0232* (2013.01); *H03G 3/301* (2013.01);
(Continued)

(58) Field of Classification Search
None
See application file for complete search history.

(56) References Cited

U.S. PATENT DOCUMENTS

| 5,598,466 A | 1/1997 | Graumann |
| 6,411,927 B1 | 6/2002 | Morin et al. |

(Continued)

FOREIGN PATENT DOCUMENTS

| EP | 1830348 A1 | 5/2007 |
| JP | 2007-235943 A | 9/2007 |

(Continued)

OTHER PUBLICATIONS

Ahmad et al., "Digital Detection and Processing of Multiple Quadrature Harmonics for EPR Spectroscopy", Journal of Magnetic Resonance, Sep. 29, 2010, 26 pages. See abstracts, Fig. 2-3.

(Continued)

*Primary Examiner* — Curtis A Kuntz
*Assistant Examiner* — Kenny H Truong
(74) *Attorney, Agent, or Firm* — Ohlandt, Greeley, Ruggiero & Perle, L.L.P.

(57) ABSTRACT

Methods and apparatus for frequency selective signal mixing for speech enhancement. In one embodiment frequency-based channel selection is performed for signal magnitude, signal energy, and noise estimate using speaker activity detection information, signal-to-noise ratio, and/or signal level, Frequency-based channel selection is performed for a dynamic spectral floor to adjust the noise estimate using speaker dominance information. Noise reduction is performed on the signal for the selected channel.

20 Claims, 13 Drawing Sheets

(51) Int. Cl.
H04R 3/12 (2006.01)
G10L 21/0232 (2013.01)
H03G 3/30 (2006.01)
H04R 1/32 (2006.01)

(52) U.S. Cl.
CPC .............. H04R 1/326 (2013.01); H04R 3/12 (2013.01); H04R 5/027 (2013.01); H04R 2499/13 (2013.01)

(56) References Cited

U.S. PATENT DOCUMENTS

| | | | |
|---|---|---|---|
| 6,674,865 | B1 | 1/2004 | Venkatesh et al. |
| 8,503,694 | B2 | 8/2013 | Tashev et al. |
| 2003/0028372 | A1 | 2/2003 | McArthur et al. |
| 2004/0015348 | A1 | 1/2004 | McArthur et al. |
| 2005/0060142 | A1 | 3/2005 | Visser et al. |
| 2005/0221777 | A1 | 10/2005 | Melly et al. |
| 2006/0222184 | A1 | 10/2006 | Buck et al. |
| 2007/0078649 | A1* | 4/2007 | Hetherington ...... G10L 21/0216 704/226 |
| 2008/0069374 | A1 | 3/2008 | Zhang |
| 2008/0260175 | A1 | 10/2008 | Elko |
| 2008/0285773 | A1 | 11/2008 | Nongpiur et al. |
| 2008/0292107 | A1 | 11/2008 | Bizjak |
| 2008/0304673 | A1 | 12/2008 | Otani |
| 2009/0055169 | A1 | 2/2009 | Goto et al. |
| 2009/0055170 | A1 | 2/2009 | Nagahama |
| 2009/0116661 | A1* | 5/2009 | Hetherington .......... G10L 21/02 381/93 |
| 2009/0164212 | A1 | 6/2009 | Chan et al. |
| 2009/0271187 | A1* | 10/2009 | Yen ..................... G10L 21/0208 704/226 |
| 2009/0310524 | A1 | 12/2009 | Katsube et al. |
| 2009/0323982 | A1* | 12/2009 | Solbach ................. H04R 3/005 381/94.3 |
| 2010/0013709 | A1 | 1/2010 | Schlee et al. |
| 2010/0076756 | A1 | 3/2010 | Douglas et al. |
| 2010/0228545 | A1 | 9/2010 | Ito et al. |
| 2011/0125218 | A1* | 5/2011 | Busby ................ A61N 1/36032 607/57 |
| 2011/0305345 | A1 | 12/2011 | Bouchard et al. |

FOREIGN PATENT DOCUMENTS

| | | |
|---|---|---|
| JP | 2009-171208 | 7/2009 |
| JP | 2009-284109 A | 12/2009 |
| JP | 2012-216998 A | 11/2012 |
| WO | WO 2006/117032 A1 | 11/2006 |
| WO | WO 2012/074503 A1 | 6/2012 |

OTHER PUBLICATIONS

EP Application No. 10860321.8-1901 Office Action dated Jul. 5, 2013, 2 pages.

EP Application No. 10860321.8 Response filed Nov. 27, 2013 14 pages.

Gunnam et al., "A Lower-Power Preamble Detection Methodology for Packet Based RF Modems on All-Digital Sensor Front-Ends", IMTC 2007—IEEE Instrumentation and Measurement Technology Conference, Warsaw, Poland, May 1-3, 2007, pp. 1-4. 4 pages.

International Search Report and Written Opinion of the International Searching Authority, PCT/US2010/058168, dated Aug. 18, 2011, 7 pages.

Japanese Patent Application No. 2013-540940 Office Action dated Oct. 20, 2014 including translation of Reasons for Rejection, 4 pages.

Matheja et al., "A Multi-Channel Quality Assessment Setup Applied to a Distributed Microphone Speech Enhancement System With Spectral Boosting", ITG 2012 Paper, Nuance Communications Aachen GmbH, 4 pages.

Matheja et al., "Dynamic Signal Combining for Distributed Microphone Systems in Car Environments", ICASSP 2011 Paper, Nuance Communications Aachen GmbH, 4 pages.

Matheja et al., "Robust Voice Activity Detection for Distributed Microphones by Modeling of Power Ratios", ITG 2010 Paper, Nuance Communications Aachen GmbH, 4 pages.

Notification Concerning Transmittal of Copy of International Preliminary Report on Patentability (Chapter I of the Patent Cooperation Treaty) dated Jun. 13, 2013, PCT/US2010/058168, 6 pages.

U.S. Appl. No. 13/990,176 Office Action dated Jan. 15, 2015, 18 pages.

U.S. Appl. No. 13/990,176 Response to Office Action filed Apr. 14, 2015, 11 pages.

U.S. Appl. No. 13/990,176 Final Office Action dated May 7, 2015, 23 pages.

U.S. Appl. No. 13/990,176 Response to Final Office Action filed Sep. 8, 2015, 18 pages.

U.S. Appl. No. 13/990,176 $2^{nd}$ submission Response to Final Office Action filed Nov. 9, 2015, with RCE, 19 pages.

Chinese Notification of First Office Action and Search Report with Current Claims (English) dated Jun. 26, 2015; For Chinese Pat. App. No. 201080070994.4; 14 pages.

Japanese Notice of Allowance with English claims dated Oct. 1, 2015; For Japanese Pat. App. No. 2013-540940; 7 pages.

Chinese Application No. 201080070994.4 Response to Office Action, including translated claims, filed Nov. 11, 2015, 16 pages.

Application No. 2010/80070994.1, Office Action dated Dec. 11, 2015, including English summary, 6 pages.

PCT International Search Report and Written Opinion dated Jul. 28, 2014 corresponding to International Application No. PCT/US2013/067464; 9 Pages.

Response (with FA Reporting Letter and Amended Claims in English) to Chinese Office Action dated Dec. 11, 2015 corresponding to Chinese Application No. 201080070994.4; Response filed on Mar. 26, 2016; 12 Pages.

U.S. Office Action dated May 11, 2016 corresponding to U.S. Appl. No. 13/990,176; 23 Pages.

PCT International Preliminary Report dated May 12, 2016 corresponding to International Application No. PCT/US2013/067464; 6 Pages.

Chinese Notice of Granting Patent Right for Invention (with English Translation) and Copy of Allowed Claims dated May 5, 2016 corresponding to Chinese Application No. 201080070994.4; 11 Pages.

European Communication Pursuant to Rules 161(2) and 162 EPC dated May 18, 2016 corresponding to European Application No. 13896231.1; 2 Pages.

Response to European Communication Pursuant to Rules 161(2) and 162 EPC dated May 18, 2016 corresponding to European Application No. 13896231.1; Response filed on Jun. 3, 2016; 6 Pages.

U.S. Appl. No. 13/990,176 Response to Office Action filed Aug. 11, 2016, 17 pages.

Final Office Action dated Nov. 17, 2016 from U.S. Appl. No. 13/990,176; 25 Pages.

Extended European Search Report for European Application No. 10860321.8 dated Dec. 2, 2016; 9 Pages.

Chandra, et al.; "Audio Mixer for Multi-party Conferencing in VoIP"; 2009 IEEE International Conference on Internet Multimedia Services Architecture and Applications (IMSAA); Dec. 9-11, 2009; 6 Pages.

Freudenberger, et al.; "Spectral Combining for Microphone Diversity Systems"; $17^{th}$ European Signal Processing Conference (EUSIPCO 2009); pp. 854-858; Aug. 24-28, 2009; 5 Pages.

Korean Amendment (with English claims) filed on Sep. 30, 2016 to the Office Action dated Aug. 23, 2016; for Koren Pat. App. No. 10-2013-7013771; 31 pages.

Extended European Search Report dated Apr. 19, 2017 for European Application No. 13896231.1; 7 Pages.

Appeal Brief to U.S. Final Office Action dated Nov. 17, 2016 for U.S. Appl. No. 13/990,176; Appeal Brief Filed on Apr. 14, 2017; 24 Pages.

(56) References Cited

OTHER PUBLICATIONS

Korean Office Action (with English Translation) dated Feb. 21, 2017 for Korean Application No. 10-2013-7013771; 5 Pages.
Response (with English Translation and Amended Claims) to Korean Office Action dated Feb. 21, 2017; for Korean Application No. 10-2013-7013771; Response filed on Mar. 2, 2017; 16 Pages.
Notice of Appeal dated Feb. 14, 2017; for U.S. Appl. No. 13/990,176; 2 Pages.
Response to EPO Communication pursuant to Rules 70(2) and 70a(2) dated Jan. 13, 2017 as filed on Jun. 20, 2017; 14 Pages.
Response to European Office Action dated May 9, 2017 for European Application No. 13896231.1; Response filed on Jul. 20, 2017; 8 Pages.
Korean Notice of Allowance dated Jul. 28, 2017 for Korean Application No. 10-2013-7013771; 7 Pages.
Response (with Amended Claims & Specification) to European Examination Report dated Feb. 15, 2018 for European Application No. 10860321.8; Response filed on Apr. 13, 2018; 16 Pages.
European Examination Report dated Feb. 13, 2018 for European Application No. 13896231.1; 6 Pages.
European Examination Report dated Feb. 15, 2018 for European Application No. 10860321.8; 5 Pages.
Response (with Claims) to European Official Communication dated Jan. 13, 2017 for European Application No. 10860321.8; Response filed Jun. 20, 2017; 12 Pages.
Examiner's Answer to Appeal Brief dated Nov. 9, 2017; for U.S. Appl. No. 13/990,176; 25 pages.
Reply Brief filed Jan. 8, 2018 to Examiner's Answer to Appeal Brief dated Nov. 9, 2017; for U.S. Appl. No. 13/990,176; 11 pages.
Response (with Amended Claims) to European Examination Report dated Feb. 13, 2018 for European Application No. 13896231.1; Response filed Jun. 11, 2018; 9 Pages.
European Examination Report dated Aug. 20, 2018 for European Application No. 13896231.1; 5 Pages.
European Notice of Allowance (with Allowed Specification) dated Jul. 24, 2018 for European Application No. 10860321.8; 32 Pages.
Response (with Amended Claims) to European Examination Report dated Aug. 20, 2018 for European Application No. 13896231.1; Response filed Feb. 25, 2019; 24 Pages.

* cited by examiner

METHODS AND APPARATUS FOR SELECTIVE MICROPHONE SIGNAL COMBINING

CROSS REFERENCE TO RELATED APPLICATIONS

This application is a National Stage application of PCT/US2013/067464 filed on Oct. 30, 2013, published in the English language on May 7, 2015 as International Publication Number WO 2015/065362 A1, entitled "Methods And Apparatus For Selective Microphone Signal Combining", which is incorporated herein by reference.

BACKGROUND

In digital signal processing, many multi-microphone arrangements exist where two or more microphone signals have to be combined. Applications may vary, for example, from live mixing scenarios associated with teleconferencing to hands free telephony in a car environment. The signal quality may differ strongly among the various speaker channels depending on the microphone position, the microphone type, the kind of background noise and the speaker himself. For example, consider a hands-free telephony system that includes multiple speakers in a car. Each speaker has a dedicated microphone capable of capturing speech. Due to different influencing factors like an open window, background noise can vary strongly if the microphone signals are compared among each other. Noise jumps and/or different coloration may be noticeable if hard switching between active speakers is done, or soft mixing functions include the higher noise level and increase the resulting noise lever.

SUMMARY

Exemplary embodiments of the invention provide efficient microphone signal combining for a system with multiple speaker-dedicated distributed microphones in noisy environments. For instance, in a car environment, multiple speakers, such as driver, front-seat passenger, and two back-seat passengers each have a dedicated microphone and may participate in a conference telephone call in the car. The signals are combined to obtain a single output signal without noticeable switching artifacts in the speech or background noise signals.

In exemplary embodiments of the invention, one noise reduction process and one automatic gain control process are used as opposed to one noise reduction process and one automatic gain control process per input channel, which realizes a significant reduction of processing resources. In one embodiment, frequency-selective signal combination is used to achieve a smoother and better-sounding output signal, such as during double-talk situations, i.e. when two or more speakers are active at the same time. To achieve enhanced efficiency, the input signals can be mixed as well as other signal-derived estimates, e.g., signal power and channel-specific noise power spectral density. In one embodiment, amplitude and phase are handled separately: in a frequency-selective way for amplitude and broadband for phase.

With this arrangement, the amount of processing and memory required for signal processing is reduced in comparison with prior approaches, as is the complexity and the size of the system. In addition, the quality of the output signal may be higher since for each frequency, the channel with the best signal-to-noise ratio (SNR) can be chosen instead of broadband weighting as in some other approaches.

In one aspect of the invention, a method comprises: receiving a plurality of microphone signals; for each channel in the microphone signals, transforming the microphone signals into the frequency subband domain; performing frequency-based channel selection using speaker activity detection information; and performing noise reduction on the signal for the selected channel after signal mixing.

The method can further include one or more of the following features: performing the frequency-based channel selection for a dynamic spectral floor to adjust the noise estimate using speaker dominance information, mixing phase information with the selected signal channel, selecting the channel having the maximum signal-to-noise ratio of the microphone signals for each subband, selecting the channel having the highest signal energy of the microphone signals for each subband, performing frequency-based selection for signal amplitude and active speaker determination for phase, performing the noise reduction using filter coefficients that are limited by a channel-independent frequency-selected spectral floor, computing the dynamic spectral floors from the speaker dominance weights of background noise for the active speaker and a previously active speaker, transforming the signal after noise reduction from the frequency subband domain back into the time domain to obtain a broadband signal, and/or performing the same frequency-based channel selection for signal magnitude and noise estimate.

In another aspect of the invention, an article comprises: a non-transitory computer-readable medium having stored instructions that enable a machine to: receive a plurality of microphone signals; for each channel in the microphone signals, transform the microphone signals into the frequency subband domain; perform frequency-based channel selection using speaker activity detection information; and perform noise reduction on the signal for the selected channel after signal mixing.

The article can further include instructions for one or more of the following features: perform the frequency-based channel selection for a dynamic spectral floor to adjust the noise estimate using speaker dominance information, mix phase information with the selected signal channel, select the channel having the maximum signal-to-noise ratio of the microphone signals for each subband, select the channel having the highest signal energy of the microphone signals for each subband, perform frequency-based selection for signal amplitude and active speaker determination for phase, perform the noise reduction using filter coefficients that are limited by a channel-independent frequency-selected spectral floor, compute the dynamic spectral floors from the speaker dominance weights of background noise for the active speaker and a previously active speaker, transform the signal after noise reduction from the frequency subband domain back into the time domain to obtain a broadband signal, and/or perform the same frequency-based channel selection for signal magnitude and noise estimate.

In a further aspect of the invention, a system comprises: a receiver module to receive a plurality of microphone signals; a speaker activity detection module to transform the microphone signals into the frequency subband domain for each channel in the microphone signals; a selective signal combination module to perform frequency-based channel selection using speaker activity detection information; and a noise reduction module to reduce noise on the signal for the selected channel after signal mixing in the selective signal combination module.

The system can further include one or more of the following features: the system performs the frequency-based channel selection for a dynamic spectral floor to adjust the noise estimate using speaker dominance information, the selective signal combination module selects the channel having the maximum signal-to-noise ratio of the microphone signals for each subband, the noise reduction module performs the noise reduction using filter coefficients that are limited by a channel-independent frequency-selected spectral floor, transform the signal after noise reduction from the frequency subband domain back into the time domain to obtain a broadband signal, and/or perform the same frequency-based channel selection for signal magnitude and noise estimate.

BRIEF DESCRIPTION OF THE DRAWINGS

The foregoing features of this invention, as well as the invention itself, may be more fully understood from the following description of the drawings in which.

DETAILED DESCRIPTION

Exemplary embodiments of the invention provide methods and apparatus for frequency-selective signal combining that supports different speakers in a noisy environment.

Particularly for deviations in the noise characteristics among the channels, various embodiments ensure a smooth transition of the background noise at speaker changes. A noise reduction (NR) module may achieve equivalent background noise characteristics for all channels by applying a dynamic, channel specific, and frequency dependent maximum attenuation. The reference characteristics for adjusting the background noise may be specified by the dominant speaker channel. In various embodiments, an automatic gain control (AGC) with a dynamic target level may ensure similar speech signal levels in all channels.

Figure 1:
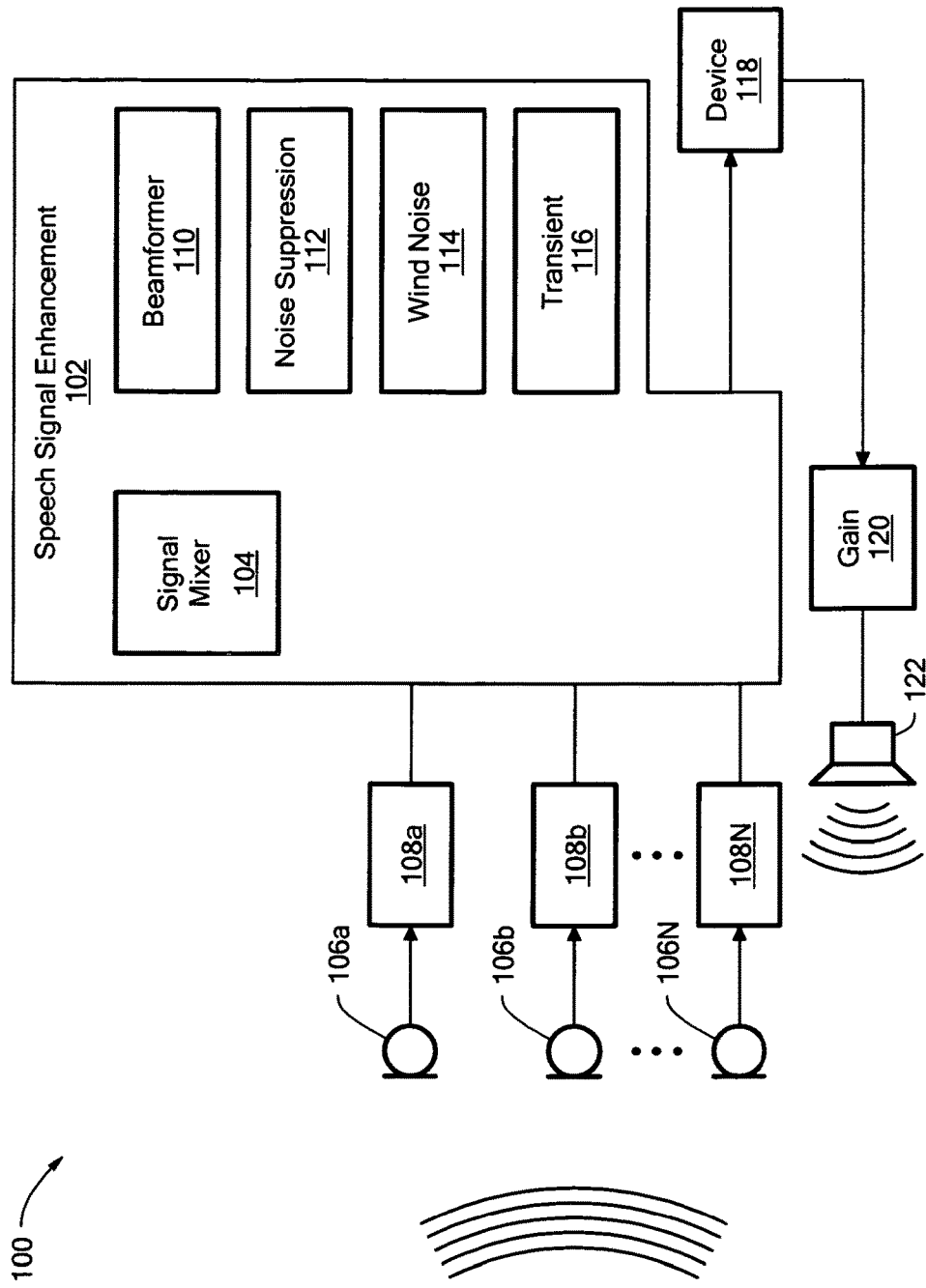
FIG. 1 is a schematic representation of an exemplary speech signal enhancement system having frequency selective signal mixing in accordance with exemplary embodiments of the invention.

FIG. 1 shows an exemplary communication system 100 including a speech signal enhancement system 102 having a signal mixer module 104 in accordance with exemplary embodiments of the invention. A microphone arrangement 106 includes one or more microphones 106a-N to receive sound information, such as speech from a human speaker. It is understood that any practical number of microphones 106 can be used to form a microphone arrangement. Respective pre-processing modules 108a-N can process information from the microphones 106a-N. Exemplary pre-processing modules 108 can include echo cancellation. Additional signal processing modules can include beamforming 110, noise suppression 112, wind noise suppression 114, transient removal 116, etc.

The speech signal enhancement module 102 provides a processed signal to a user device 118, such as a mobile telephone. A gain module 120 can receive an output from the device 118 to amplify the signal for a loudspeaker 122 or other sound transducer.

Figure 1A:
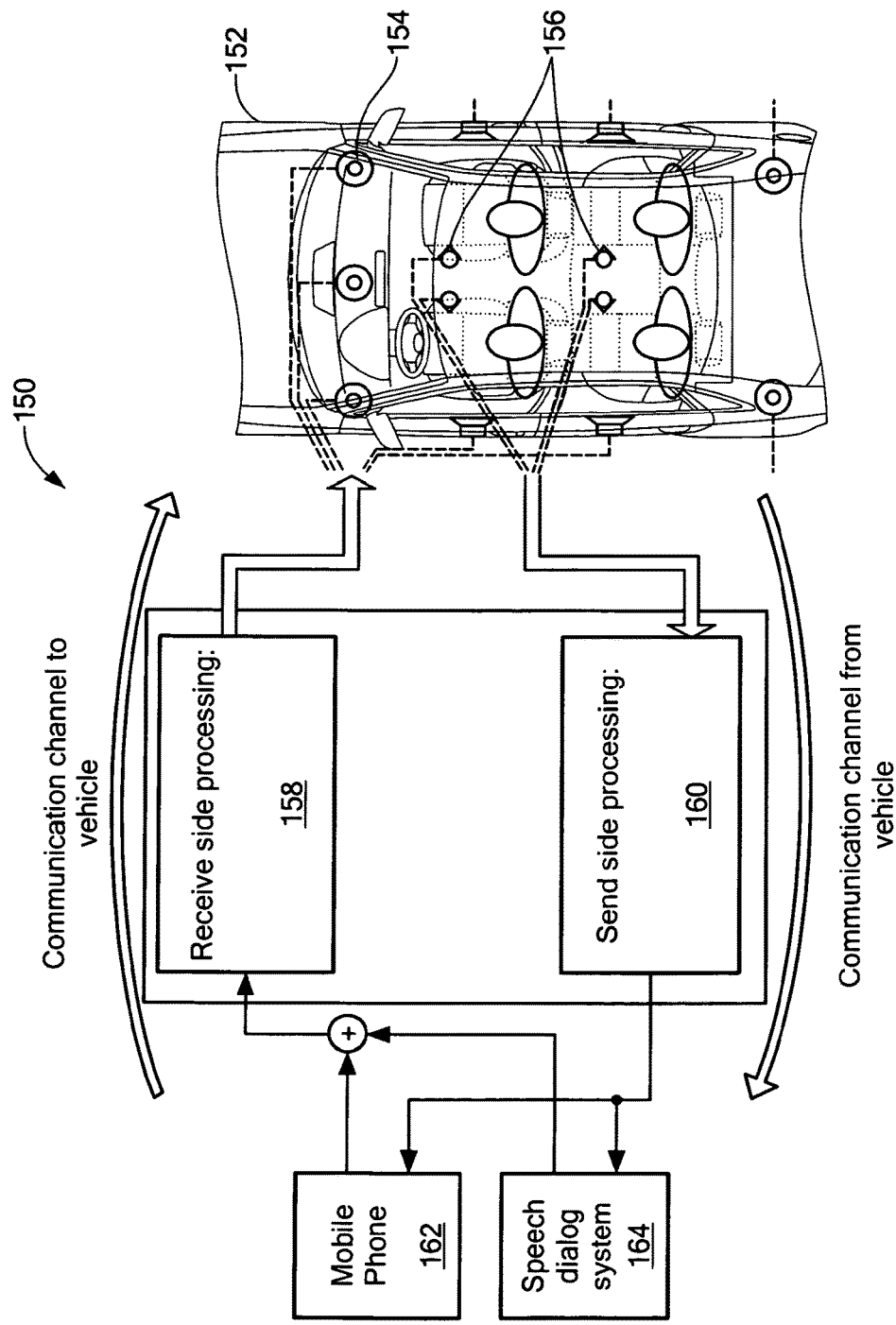
FIG. 1A is a schematic representation of a vehicle having speaker dedicated microphones for a speech signal enhancement system having frequency selective signal mixing.

FIG. 1A shows an exemplary speech signal enhancement system 150 for an automotive application. A vehicle 152 includes a series of loudspeakers 154 and microphones 156 within the passenger compartment. In one embodiment, the passenger compartment includes a microphone 156 for each passenger. In another embodiment (not shown), each passenger has a microphone array.

In embodiments of the invention, any speaker dedicated microphone signal can be replaced by a beam former output signal. In one embodiment, there are speaker-dedicated microphone arrays, e.g., a two-element array for the driver and a separate two-element array for the front passenger. Alternatively, a common microphone array (e.g. in the middle of the car) can be used jointly for a beam former processing that points to the driver and a beam former processing that points to the front passenger. The output signal of these beamformers can be used for mixing signals as described in detail below, instead of directly using the microphone signals.

The system 150 can include a receive side processing module 158, which can include gain control, equalization, limiting, etc., and a send side processing module 160, which can include speech activity detection and signal mixing, such as the signal mixer module 104 of FIG. 1, echo suppression, gain control, etc. It is understood that the terms receive side and send side are relative to the illustrated embodiment and should not be construed as limiting in any way. A mobile device 162 can be coupled to the speech signal enhancement system 150 along with an optional speech dialog system 164.

In an exemplary embodiment, a speech signal enhancement system is directed to environments in which each person in the vehicle has only one dedicated microphone as well as vehicles in which a group of microphones is dedicated to each seat to be supported in the car.

Figure 2:
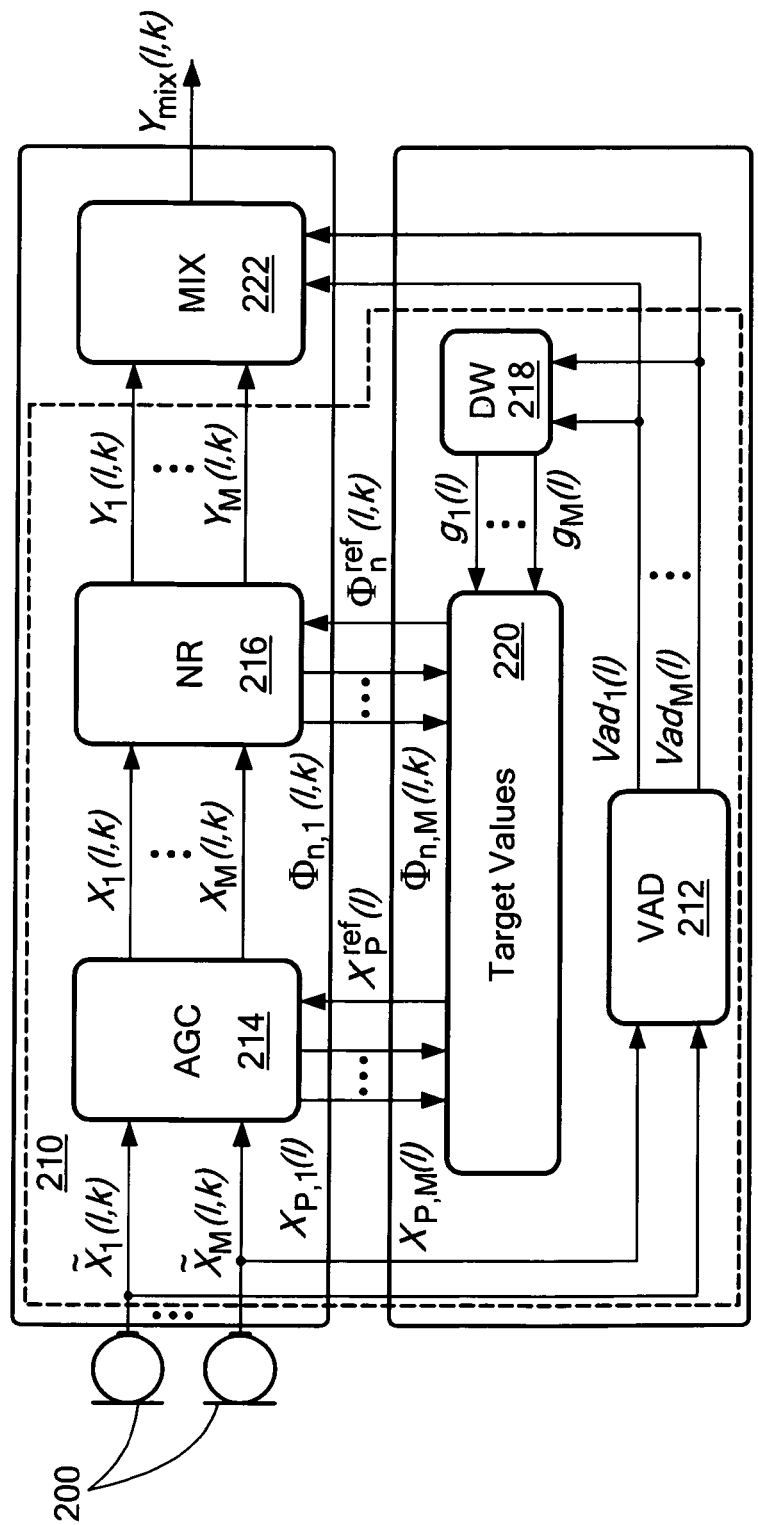
FIG. 2 shows a system overview of a signal processing system for dynamic mixing of signals.

FIG. 2 shows a system overview of a signal processing system for dynamic mixing of signals. Applications of the system may vary, from live mixing scenarios over teleconferencing systems to hands free telephony in a car system. The system includes M microphones 200, with microphone index m, that are associated, without limitation, to M input signals. The M input signals are combined to form one (or more) output signals Y.

Due to changing acoustic situations including, but not limited to speaker changes, the microphone signal levels typically vary over time. Furthermore, various microphones 200 may be positioned, without limitation, in different speakers that are located apart from each other so as to have varying noise characteristics. For example, various speakers may be positioned in different passenger compartments of a vehicle, such as an automobile or boat, or at different locations for a conference call.

In illustrative embodiments, a preprocessing module 210 receives the signals from microphones 200, and dynamically filters each of the signals according to a noise reduction algorithm, creating preprocessed signals $Y_1$ to $Y_M$ having substantially equivalent noise characteristics. The preprocessing module 210 may include, without limitation, a Speaker Activity Detection (SAD)/Voice Activity Detection (VAD) 212 that determines the dominance of each microphone and/or speaker, whereupon Dominance Weights (DW) are computed 218 that contribute to calculate target values 220 for adjusting the AGC 214 and the maximum attenuation of the NR 216. After these preprocessing steps the signals in each channel have been driven to similar sound level and noise characteristics, and are combined, for example, at mixer 222.

The processing may be done in the frequency domain or in subband domain where e denotes the frame index and k the frequency index. The short-time Fourier transform may use a Hann window and a block length of, without limitation, 256 samples with 75% overlap at a sampling frequency of 16000 Hz. Each microphone signal may be, for example, modeled by a superposition of a speech and a noise signal component:

$$\tilde{X}_m(l,k) = \tilde{S}_m(l,k) + \tilde{N}_m(l,k). \tag{1}$$

In accordance with various embodiments, when computing the target levels 220, it is often important to know which speaker/microphone is the dominant one at a time instance. Dominance weights (DW) 218 may be determined by evaluating the duration for which a speaker has been speaking. The DW 218 may be used later on to set the target values 220. If only one speaker is active the target values may be controlled by this concrete channel alone after a predetermined amount of time. If all speakers are active in a similar way the target values may correspond, without limitation, to the mean of all channel characteristics. A fast change of the DW could result in level jumps or modulations in the background noise. Therefore, a slow adaptation of these weights is recommended (e.g. realized by strong temporal smoothing).

To determine values for the necessary fullband VAD $vad_m(l)$ for each channel, various methods may be used, such as the one described in T. Matheja and M. Buck, "*Robust Voice Activity Detection for Distributed Microphones by Modeling of Power Ratios*," in 9. ITG-Fachtagung Sprachkommunikation, Bochum, October 2010, which is hereby incorporated herein by reference in its entirety. For example, specific counters $c_m(l)$ may, without limitation, be increased for each time frame and each channel the specific speakers are active ($vad_m(l)=1$), otherwise the counters are decreased or left unchanged:

$$c_m(\ell) = \begin{cases} \min\{c_m(\ell-1) + c_{inc}, c_{max}\}, & \text{if } vad_m(\ell) = 1, \\ \max\{c_m(\ell-1) - c_{dec,m}, c_{min}\}, & \text{if } vad_{m'}(\ell) = 1, m' \neq m \\ c_m(\ell-1), & \text{else.} \end{cases} \tag{2}$$

The limitations of the counters by $c_{max}$ or $c_{min}$ respectively define full or minimal dominance of a speaker. In various embodiments, the increasing interval $c_{inc}$ of the counters may be set in such a way that the current speaker is the dominant one after speaking $t_{inc}$ seconds. With the update time $T_{frame}$ between two consecutive time frames it follows:

$$c_{inc} = \frac{c_{max} - c_{min}}{t_{inc}} \cdot T_{frame}. \tag{3}$$

The decreasing constant may be recomputed for a channel m if another speaker in any other channel m' becomes active. In this embodiment, single-talk is assumed. In such embodiments, the dominance counter of the previous speaker may become $c_{min}$ after the time the new active speaker reaches $c_{max}$ and therewith full dominance. Including a constant ε with a very low value to avoid the division by zero, $c_{dec,m}$ may be determined by $$c_{dec,m} = \frac{c_m(\ell) - c_{min}}{c_{max} - c_{m'}(\ell) + \varepsilon} \cdot c_{inc}, \tag{4}$$

if $$vad_m(\ell) = 0.$$

Figure 2A:
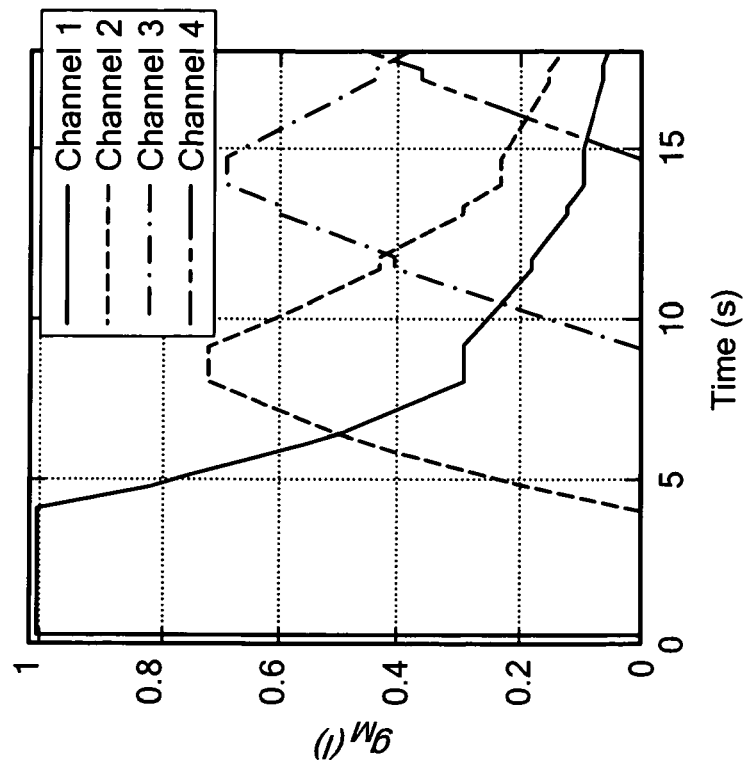
FIG. 2(a) shows exemplary counters (with $c_{max}$=100) associated with various channels and FIG. 2(b) shows the counters mapped to speaker dominance weights $g_m(l)$ that characterize the dominance of a speaker.
Figure 2B:
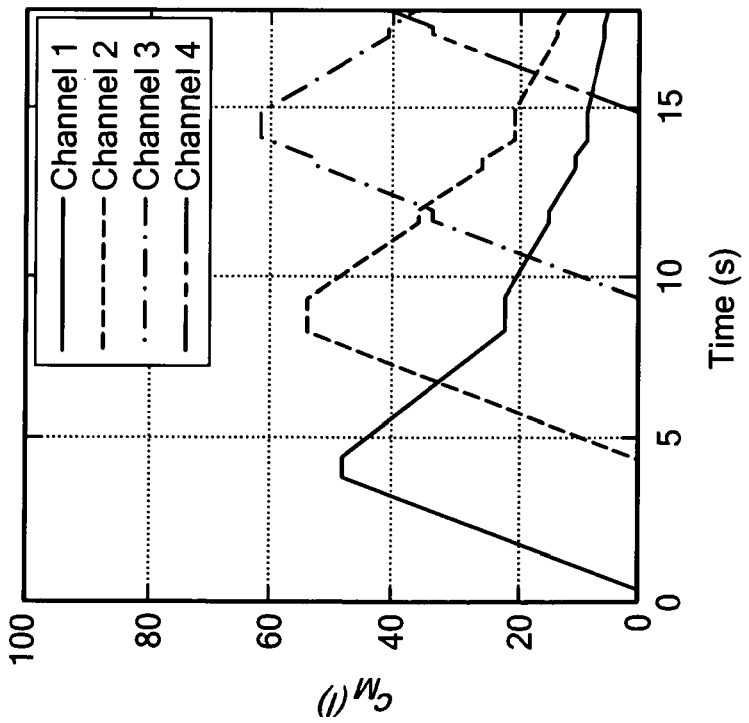

Illustratively, FIG. 2(a) shows exemplary counters (with $c_{min}=0$ and $c_{max}=100$), which can be mapped, as shown in FIG. 2(b), to speaker dominance weights $g_m(l)$ that characterize the dominance of a speaker:

$$g_m(\ell) = \frac{c_m(\ell)}{\sum_{n=1}^{M} c_n(\ell)}. \tag{5}$$

To compensate for the above-mentioned speech and/or noise level differences, an AGC 214 and a dynamic NR 216 are presented below that perform an adaptation to adaptive target levels computed out of the underlying microphone signals, in accordance with various embodiments.

Figure 3:
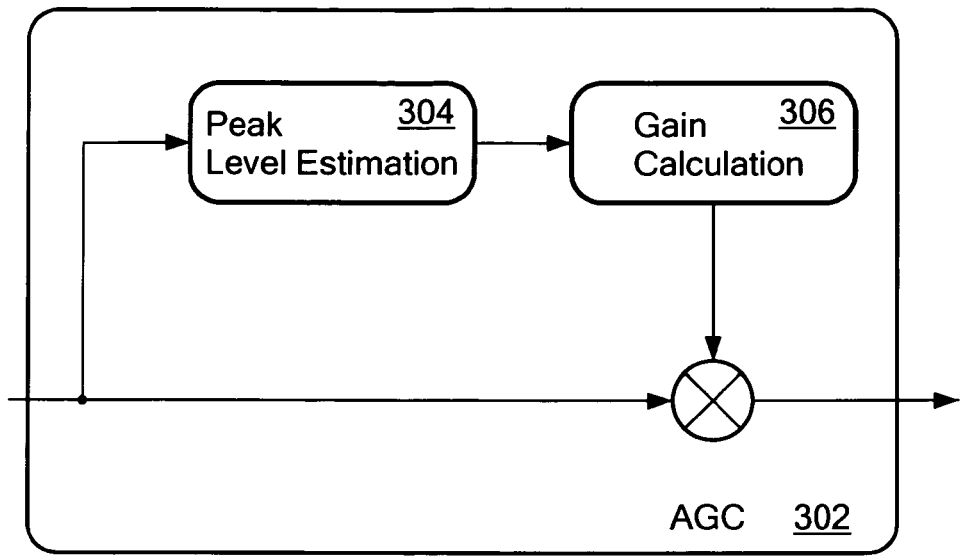
FIG. 3 shows a block diagram of an Automatic Gain Control (AGC) module.

FIG. 3 shows a block diagram of an AGC in accordance with an embodiment. Based on the input signal $\tilde{X}_m(l,k)$, the AGC 302 may estimate, without limitation, the peak level $\hat{X}_{P,m}(k)$ in the m-th microphone signal 304 and determines a fullband amplification factor $a_m(l)$ 306 to adapt the estimated peak level to a target peak level $X_p^{ref}(l)$.

An illustrative method for peak level estimation is proposed in E. Hänsler and G. Schmidt, *Acoustic Echo and Noise Control: A Practical Approach*. Hoboken, N.J., USA: John Wiley & Sons, 2004, vol. 1, which is hereby incorporated herein by reference in its entirety. Instead of using the time domain signal for peak tracking, a root-mean-square measure may be applied over all subbands. The AGC 214 may be processed in each channel with frequency independent gain factors. Then the output results in $$X_m(l,k) = a_m(l)\tilde{X}_m(l,k), \tag{6}$$

with the recursively averaged gain factors $$a_m(\ell) = \gamma \cdot a_m(\ell-1) + (1-\gamma) \cdot \frac{X_P^{ref}(\ell)}{\hat{X}_{P,m}(\ell)}. \tag{7}$$

Here γ denotes the smoothing constant. The range of γ may be, without limitation, 0<γ<1. For example, γ may be set to 0.9. The target or rather reference peak level $X_P^{ref}(l)$ is a weighted sum of all peak levels and is determined by $$X_P^{ref}(\ell) = \sum_{m=1}^{M} g_m(\ell) \cdot \hat{X}_{P,m}(\ell). \tag{8}$$

Thus, in illustrative embodiments, the reference speech level may be mainly specified by the dominant channel, and the different speech signal levels are adapted to approximately the same signal power.

Figure 4:
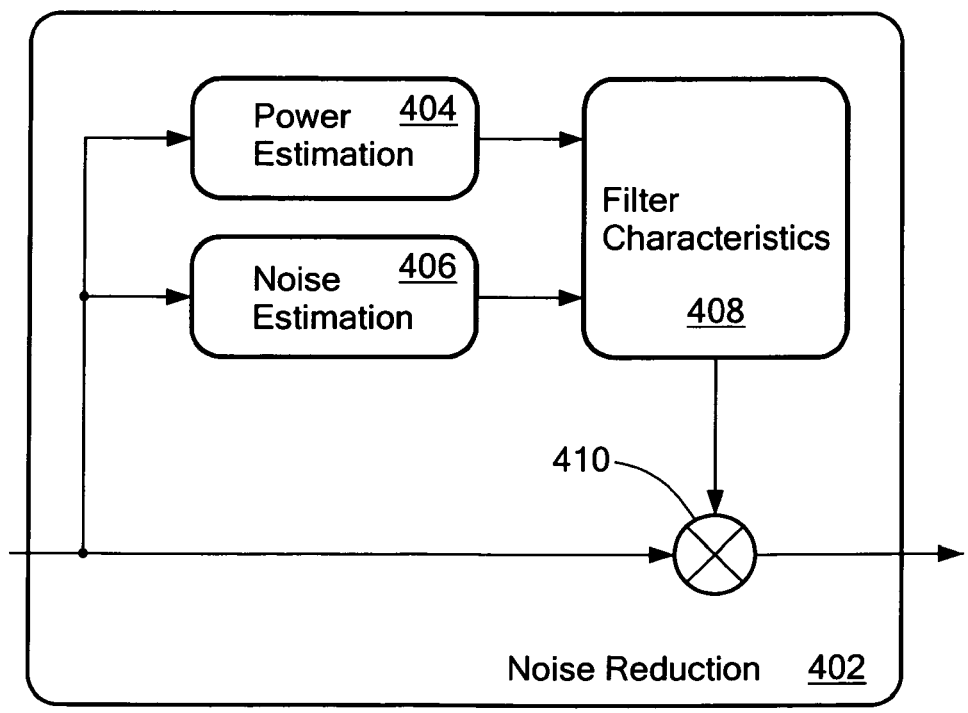
FIG. 4 shows a block diagram of a Noise Reduction (NR) module.

Illustratively, the dynamic NR 216 may aim for equal power and spectral shape of the background noise for all channels. FIG. 4 shows a block diagram of a NR 402, that may include both power and noise estimators 404 and 406, respectively, that determine filter characteristics 408 for filtering 410 the incoming signal. The maximum attenuation may be varied for each microphone and for each subband. With $\tilde{\Phi}(l,k)$ denoting the estimated noise power spectral density (PSD) in the m-th microphone channel, the noise PSDs after the AGC 214 result in $$\Phi_{n,m}(l,k) = a_m^2(l) \Phi_{n,m}(l,k). \tag{9}$$

For the NR 216, different characteristics may be chosen that are based on spectral weighting. For example, the NR filter coefficients $\tilde{H}_m(l,k)$ may be calculated by a recursive Wiener characteristic (see E. Hänsler et al.) with the fixed overestimation factor β, the maximum overestimation α and the overall signal PSD $\Phi_{x,m}(l,k)$ estimated by recursive smoothing:

$$\tilde{H}_m(\ell, k) = 1 - \min\left(\alpha, \frac{\beta}{H_m(\ell-1, k)}\right) \frac{\Phi_{n,m}(\ell, k)}{\Phi_{x,m}(\ell, k)}. \tag{10}$$

For realizing a maximum attenuation in each channel the filter coefficients may be limited by an individual dynamic spectral floor $b_m(l,k)$:

$$H_m(l,k) = \max(\tilde{H}_m(l,k), b_m(l,k)). \tag{11}$$

After setting a reference floor $b^{ref}$ specifying the overall noise reduction and after estimating a common target noise PSD $\Phi_n^{ref}(l,k)$ the spectral floors may be determined by $$b_m(\ell, k) = b^{ref} \cdot \sqrt{\frac{\Phi_n^{ref}(\ell, k)}{\Phi_{n,m}(\ell, k)}}. \tag{12}$$

Here the target noise PSD may be computed adaptively similar to the target peak level in Eq. 8 by the dominance weights:

$$\Phi_n^{ref}(\ell, k) = \sum_{m=1}^{M} g_m(\ell) \cdot \Phi_{n,m}(\ell, k). \tag{13}$$

Figure 5A:
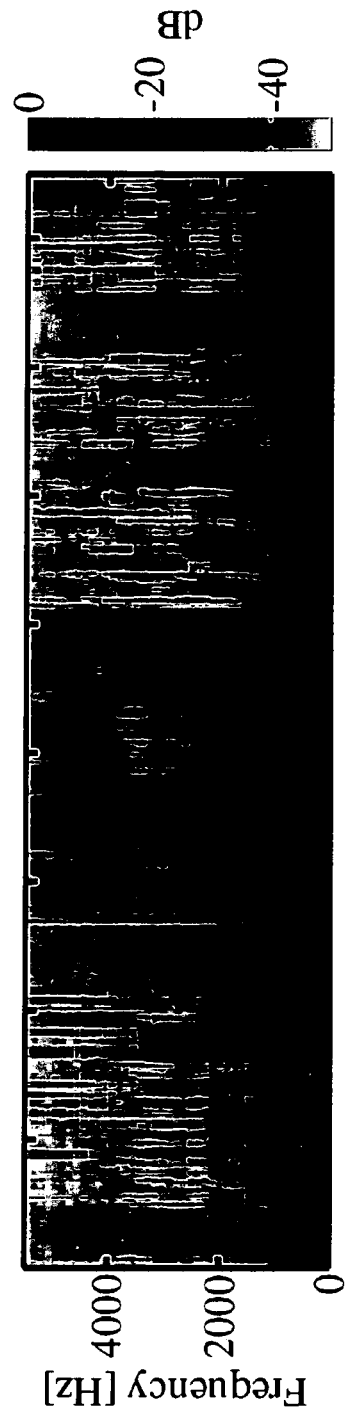
FIG. 5(a) shows a processed output signal after inter channel switching (no NR) and FIG. 5(b) shows the resulting processed signal with $b^{ref}$=0.4.
Figure 5B:
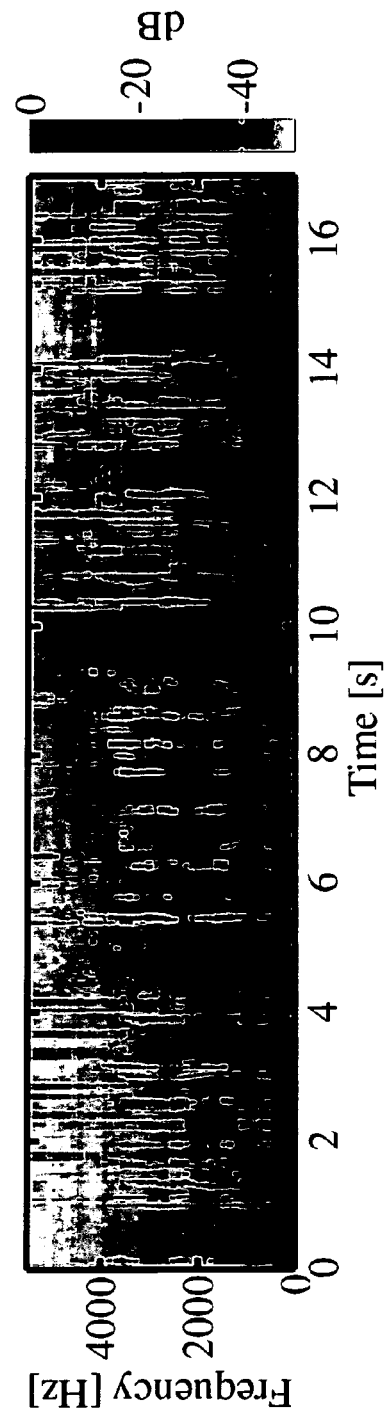

Differences in the noise levels and colorations over all channels may be, without limitation, compensated by the dynamic spectral floor $b_m(l,k)$. FIG. 5(a) shows the output signal after inter channel switching (no NR). FIG. 5(b) shows the spectrogram of the resulting processed signal with $b^{ref}=0.4$, in accordance with an embodiment. In various embodiments, it is not compulsory to do as much noise reduction as possible, but rather as much as desired to compensate for the mentioned different noise characteristics.

Illustratively, for adequate performance of the NR 216 a limit may advantageously be introduced:

$$b_m(l,k) \in [b^{min}, b^{max}] \text{ with } b^{min} \le b^{ref} \le b^{max}. \tag{14}$$

If the AGC weights are in the range $$\frac{b^{ref}}{b^{max}} \sqrt{\frac{\Phi_n^{ref}(\ell-1, k)}{\Phi_{n,m}(\ell, k)}} < a_m(\ell) < \frac{b^{ref}}{b^{min}} \sqrt{\frac{\Phi_n^{ref}(\ell-1, k)}{\Phi_{n,m}(\ell, k)}}. \tag{15}$$

the processing will typically work fine, otherwise residual switching effects may be audible. To obtain the processed signals, the filter coefficients from Eq. 11 may be applied to the complex-valued signal in the frequency domain:

$$Y_m(l,k) = H_m(l,k) X_m(l,k). \tag{16}$$

As a result, all signals are driven to show similar noise characteristics (for example, equivalent power and/or spectral shape) and a smooth transition period between the particular active speaker channels. Differences in the strength of the noise signals are tolerated but only may come to the fore after some time if, for example, only one speaker is the dominant one.

The processed signals are now combined at mixer 222 to get, without limitation, one output signal. In various embodiments, a plurality of outputs may be realized by any combination of the processed signals. Of course, the weights for combining the signals can be chosen independently from the dominance weights, and a variety of different methods may be applied. The mixer weights may be based, without limitation, on speech activity, using, for example, output from the VAD 212. Hard switching methods would apply real-valued weights with discrete values. Alternatively, the switching between channels may be realized more smoothly by soft weights which are increased and decreased with a certain speed depending on speech activity. More sophisticated mixing methods may use frequency dependent weights which are assigned dynamically depending on the input signals. Those methods may also include complex-valued weights to align the phases of the speech components of the input signals. In this case, the output signal may yield an improved SNR due to constructive superposition of the desired signal.

In accordance with various embodiments, for example, where single talk situations can be assumed where only one speaker is active at the same time, it may be appropriate to use real-valued fullband weights $w_m(l)$:

$$Y_{mix}(\ell, k) = \sum_{m=1}^{M} w_m(\ell) Y_m(\ell, k). \tag{17}$$

Due to the adjustment of the different signal characteristics in all the channels one can switch between the active speakers without noticing any switching effects. The weights $w_m(l) \in \{0,1\}$ may be determined by the VAD 212 and are held until another speaker becomes active. When using soft weights for mixing, the mixer weights $w_m(l)$ have to change fast. For example, an onset of a new (inactive up to now)

speaker requires a fast increase in the corresponding weight (attack) in order not to miss much speech. The decay (release) is usually done more slowly because it is probable that the active speaker continues speaking.

Generally, any mixing methodology known in the art may be applied. For example, mixing methodologies that apply frequency depending weights (e.g., diversity techniques) or even complex-valued weights (e.g., such as SNR optimizing techniques), may be, without limitation, utilized.

In order to save computational effort, in various embodiments not all channels are processed completely. For example, noise reduction and/or AGC may be calculated only for the N most active channels. Illustratively, the channels with the highest mixer weights $w_m(l)$ could be taken ($1 \leq N < M$). The other channels are not processed and the corresponding mixer weights are set to zero. They do not contribute to the output signal at all. In the case that more than N speakers are active at the same time, there may be the problem that at least one speaker is not covered optimally. However, in a car environment the speech signal of this speaker may come over cross-coupling into the output signal of the mixer, and thus, not completely suppressed.

In general, computational effort is kept at a minimal if NR is calculated for the currently active channel only (only one NR is calculated at any point of time). In this case all weights are either 0 or 1. The "mixing" becomes a trivial "channel selection". For this special case it is possible to move the NR stage after the mixer and have only one instance of the NR that is always active. Handling the noise and signal power estimates which are necessary for NR is trivial for the channel selection but complicated for the mixing case. These power estimates can be passed through the mixer by the same channel selection method as the signal itself. When applying soft weights instead of channel selection this would be much more complex to realize.

In one aspect of the invention, frequency selective microphone signal mixing enhances speech signal processing. For systems having speaker-dedicated microphones, signals are combined to provide a single output signal with reduced switching artifacts and background noise. Since a single channel is generated and processed, the amount of processing is reduced in comparison with systems in which multiple channels are processed. In exemplary embodiments, in order to adjust the possibly different signal characteristics across the input channels, a single noise reduction are utilized.

Figure 6:
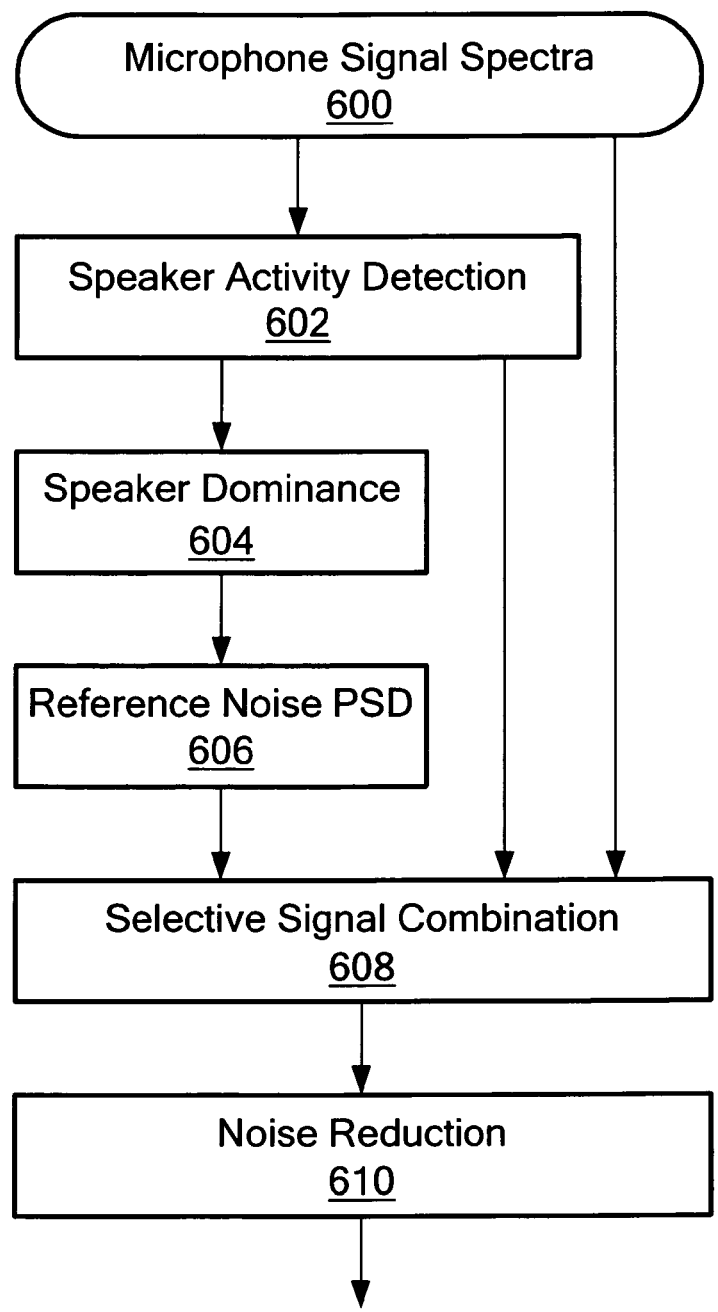
FIG. 6 is a flow diagram showing an exemplary sequence of steps for frequency selective signal mixing.

FIG. 6 shows a high level flow diagram showing an exemplary sequence of processing steps. In step 600 signal spectra from a plurality of speaker-dedicated microphones is received. In step 602, speaker activity detection (SAD) is performed and in step 604 speaker dominance processing is performed. In step 606, a reference noise power spectral density is determined. In step 608, selective signal combining is performed based on the SAD, signal spectra and noise PSD information. In step 610, noise reduction processing is performed.

In general, signals from the microphone signals are received to which a transformation is performed into a subband domain for each channel. The system estimates a background noise spectrum for each channel and calculates a reference noise spectrum. Spectral noise adjustment factors are then calculated for each channel. Channel selection is then performed from the signal spectrum, the noise estimate, and the adjustment factor for each subband. Noise reduction is performed on the basis of the selected signal spectrum, noise estimate and noise adjustment factor. The subband signals can be synthesized to a broadband signal.

In an exemplary embodiment, the active speaker is determined based on the comparison of different signal power ratios estimated for each speaker-dedicated microphone. Speaker activity detection (SAD) controls the hard switching between the input channel signals. In one embodiment, the level of a time-frequency bin of one of the inactive channels is, however, chosen if this given signal shows both the maximum SNR and the maximum level across all channels for this time-frequency. In double-talk situations, when a single active speaker cannot be selected, the last active channel prevails should maximum SNR and level not be found in the same channel. This frequency-wise selection is only done for the amplitude; the phase of the active speaker's signal is chosen for the whole spectrum, regardless of SNR and level of other channels. In double-talk situations, the phase of the last active channel is used.

In exemplary embodiments, a single noise reduction process is performed for each channel before or after the signal mixer by considering the speaker activity detection result. Frequency-selective mixing weights can be used instead of applying broadband weights to achieve better-sounding output signals. Alternatively, mixing can be performed in a conventional manner using frequency-dependent signal combination with soft weights for noise reduction prior to the mixer. In exemplary embodiments, the system estimates the noise power of each input signal before the mixer and fades background noise characteristics depending on speaker dominance required to mix not only the signal itself, but also the noise estimate. In one embodiment, hard mixing weights (1 or 0) are used in since mixing noise estimates is a quadratic quantity.

Figure 7:
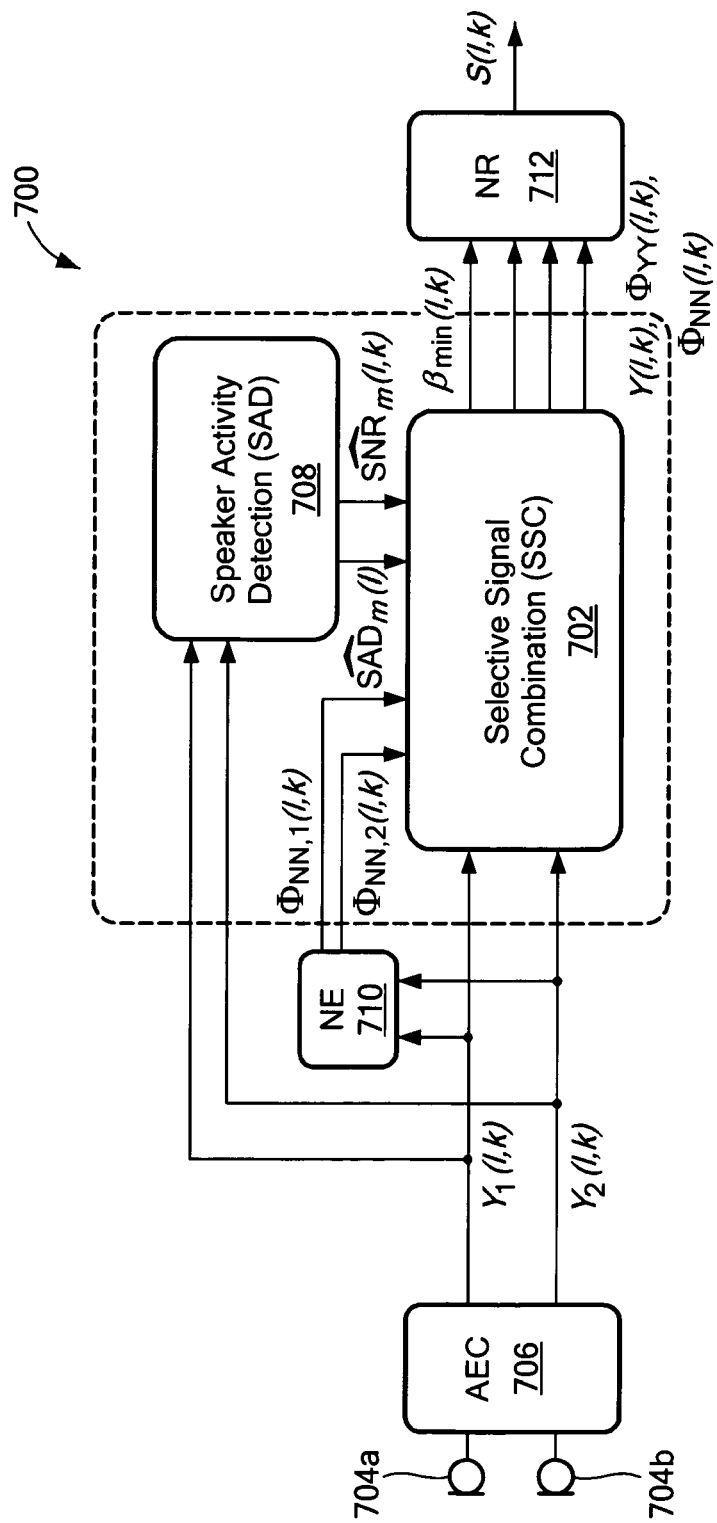
FIG. 7 is a schematic representation of an exemplary system having frequency selective signal mixing.

FIG. 7 shows an exemplary two-channel signal processing system 700 having a selective signal combination module 702 in accordance with exemplary embodiments. Signals from microphones 704a,b are received by an acoustic echo cancellation (AEC) module 706, which outputs signal spectra $Y_1(l,k)$, $Y_2(l,k)$ to the selective signal combination module 702 and to a speaker activity detection module 708. A noise estimate module 710 also receives the signal spectra to provide noise PSD estimates $\Phi_{NN,1}(l,k)$, $\Phi_{NN,2}(l,k)$ to the selective signal combination module 702. The output of the selective signal combination module 702 is provided to a noise reduction module 712.

In an exemplary embodiment, the speaker activity detection module 708 provides binary fullband detection $\widehat{SAD}_m(l) \in \{0, 1\}$ indicating activity of the m-th speaker, which can be used to realize signal combination by switching between the active speaker signals. The signal-to-noise ratio (SNR) $\widehat{SNR}_m(l,k)$ computed by the speaker activity detection module 708 can be used for always selecting the channel with the best signal quality in a frequency-selective manner.

The selective signal combination (SSC) module 702 switches frequency-selectively between signal spectra and the signal-derived estimates (signal and noise power spectral densities (PSDs)) resulting in mixed values $Y(l,k)$, $\Phi_{YY}(l,k)$, $\Phi_{NN}(l,k)$ to the noise reduction module 712. Depending on the dominant channel and the necessary background noise adjustment in each channel, it is also switched between different maximum attenuation values that are applied later in the noise reduction module 712. The mixed maximum attenuation vector is denoted by $\beta_{min}(l,k)$. After noise reduction the mixed and noise reduced signal $S(l,k)$ is generated.

Figure 8:
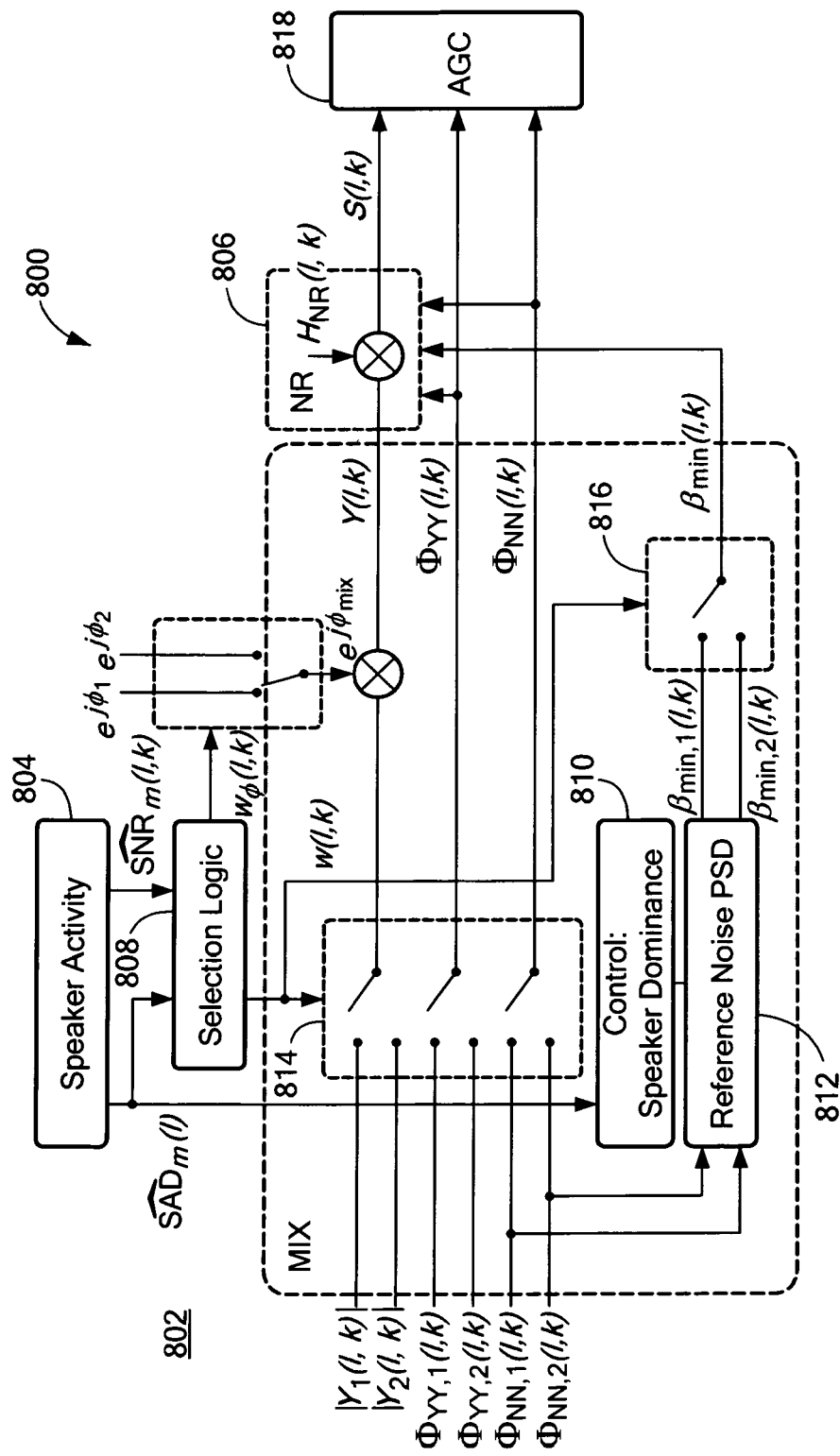
FIG. 8 is a schematic representation showing further detail for the system of FIG. 7.

FIG. 8 shows further detail of the system 700 of FIG. 7 for selective signal combination for a two-channel system 800 in accordance with exemplary embodiments of the invention. A selective signal combination module 802 is coupled to a speaker activity detection module 804 and to a noise reduction module 806, as described in conjunction with FIG. 7. The selective signal combination module 804 includes a selection logic module 808 for making phase and signal selections, as described more fully below. A speaker dominance module 810 is coupled to the speaker activity detection module 804 and to a reference noise PSD module 812, which receives noise PSD estimates $\Phi_{NN,1}(l,k)$, $\Phi_{NN,2}(l,k)$ and speaker dominance information and outputs attenuation vectors. A selected attenuation vector $\beta_{min}(l,k)$ is used by the noise reduction module 806.

In one embodiment, as determined by the speaker activity detection module 804, the channel and subband with maximum signal-to-noise ratio $\widehat{SNR}_m(l,k)$ the available microphone signals is selected if the selected channel also has the highest signal energy at the same time. This frequency-wise selection is only done for amplitude; during single-talk the phase of the active speaker's signal is chosen for the whole spectrum and controlled by the detected active speaker.

The speaker activity detection module 804 controls the hard switching between the input channel signals via the selection logic module 808. There is also switching between the signal PSD estimates of the two channels $\Phi_{YY,1}(l,k)$, $\Phi_{YY,2}(l,k)$ and between the noise PSD estimates $\Phi_{NN,1}(l,k)$, $\Phi_{NN,2}(l,k)$, which are used by the noise reduction module 806, as described below. The level of a time-frequency bin of one of the inactive channels can, however, be selected if this given signal shows both the maximum SNR and the maximum level across all channels for this time-frequency. In double-talk situations, when a single active speaker cannot be selected, the last active channel can prevail should maximum SNR and level not be found in the same channel. This frequency-wise selection is only done for the amplitude; the phase of the active speaker's signal is selected by the selection logic module 808 for the whole spectrum, regardless of SNR and level of other channels. In double-talk situations, e.g., the phase of the last active channel can be used.

In one embodiment, in addition to the mixed signal, a binary mask, as shown in FIG. 9 is computed that describes the frequency-selective channel selection for the input signals.

The mask can be used to combine signal-derived estimates based on the SAD, and the SNR and level in the input signals.

Figure 9A:
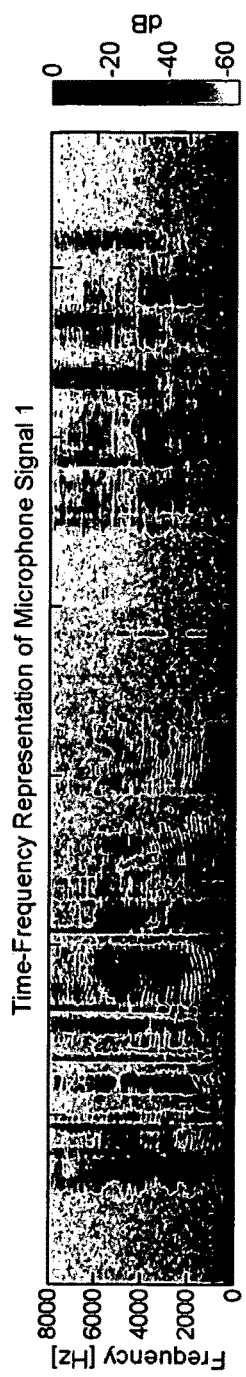
FIG. 9A is a time-frequency representation of a first microphone signal.
Figure 9B:
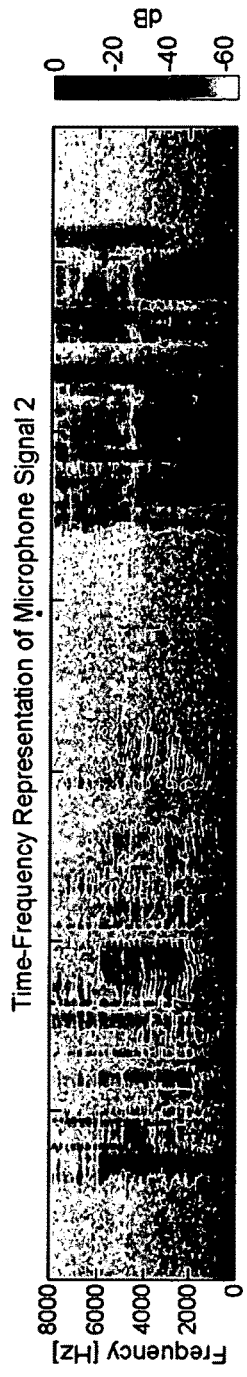
FIG. 9B is a time-frequency representation of a second microphone signal.
Figure 9C:
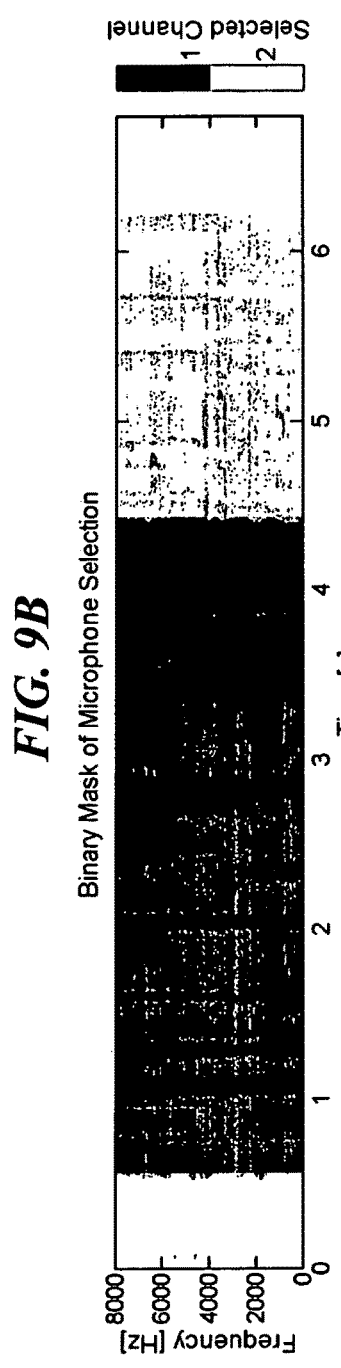
FIG. 9C is a binary mask showing microphone selection.

FIG. 9A shows a time-frequency representation of a first microphone signal (driver) and FIG. 9B shows a time-frequency representation of a second microphone signal (passenger). In the illustrative embodiment, a two-channel system has two front passengers speaking one after another with one utterance each. The driver is speaking between second 0.5 and 3.5 and the front passenger is active between second 4.5 and 6.5. It can be seen that the signal component in the dedicated microphone is of higher energy but due to the microphone arrangement (e.g., A-pillar of a car) crosstalk components occur in each case. FIG. 9C shows a binary mask of the resulting microphone selection for switching the channel to the currently active speaker in a broadband manner but for some subbands the other channel is selected (e.g., the SNR is larger in this channel). The last active channel is used if no speaker is active Referring again to FIG. 8, the applied phase-term is denoted by $e^{j\Phi_{mix}}$ and selected based on $\widehat{SNR}_m(l,k)$ resulting in the complex output spectrum Y(l,k). During double-talk situations, the phase value of the last active channel can be used or a switching of the complex spectra can be performed (magnitude and phase). The channel representing the phase is selected by $w_\phi(l,k)$ and in case of using the last active channel this is identical for all subbands k.

A selection value w(l,k) from the selection logic module 808 includes the index of the microphone channel that is selected for each time frame and frequency subband. The selection value w(l,k) is provided to a first selector module 814 for signals and a second selector module 816 for noise attenuation.

In an exemplary embodiment, the noise reduction module 806 outputs a mixed output signal that can be denoted by $S(l,k)=H_{NR}(l,k)\cdot Y(l,k)$, where the filter coefficients $H_{mix}(l,k)$ are limited by a channel-independent frequency selective spectral floor:

$$H_{NR}(l,k)=\max\{\tilde{H}_{NR}(l,k),\beta_{min}(l,k)\} \quad (18)$$

The noise reduction filter coefficients, after applying the switching between the channels, can be computed as:

$$\tilde{H}_{NR}(\ell,k) = 1 - \frac{\Phi_{NN,w(\ell,k)}(\ell,k)}{\Phi_{YY,w(\ell,k)}(\ell,k)} \quad (19)$$

It is understood the invention is not limited to the Wiener filter rule of equation (19) but can be used with other noise reduction methods that operate in the frequency domain, see. e.g., Hänsler cited above.

In one embodiment, to compute the frequency selective floor that has to be applied speaker dominance weights are computed, such as described above. A reference noise PSD can be denoted by $\Phi_{NN}(l,k)$ and determined based on the dominance weights.

For the maximum attenuation within the noise reduction, a channel-dependent frequency-dependent spectral floor $\beta_{min,m}(l,k)$ can be defined for each of the m channels to ensure an adjustment of the background noise to the reference noise PSD level. In the illustrative embodiment, the reference noise PSD module 812 generates the spectral floors for the channels with input from the noise PSD estimates $\Phi_{NN,1}(l,k)$, $\Phi_{NN,2}(l,k)$, and speaker dominance module 810. To allow a smooth background noise transition when the active speaker changes, dominance weights are computed based on the SAD, such as described above. The noise signal characteristics can be controlled by the currently dominant channel by controlling the maximum attenuation in the noise reduction module 806. It should be noted that these smooth transitions are only desired and effected on the noise signal characteristics; active speaker changes are reflected immediately in the output signal.

In illustrative embodiments, the adjustment of the noise signal characteristics is performed in the noise reduction module 806 as a single stage noise reduction following the selective signal combination module 802. As described more fully below, the noise reduction adjusts the background noise to a reference level defined as the combination through the dominance weights of the background noise of the active speaker and of that of the previous active speaker. Considering the background noise power spectral density estimates of each input signal, a frequency-selective dependent factor is computed to adjust the current noise estimate to the reference one. For each input signal, adjustment factors are computed and applied within the noise reduction module 806 by realizing a frequency-selective modification of the maximum attenuation.

In an exemplary embodiment, the overall spectral floor $\beta_{min,m}(l,k)$ selected by the second selector module 816 comprises for each channel a fix factor $\beta^{fix}$ (ensuring the overall noise reduction performance) and the dynamic frequency-selective part $v_m(l,k)$ realizing the background noise PSD adjustment:

$$v_m(\ell, k) = \sqrt{\frac{\Phi_{NN}^{ref}(\ell, k)}{\Phi_{NN,m}(\ell, k)}} \tag{20}$$

For a channel-independent noise floor after switching between the channels follows (channel w(l,k) is selected):

$$\beta_{min}(l,k) = \beta^{fix} \cdot v_{w(l,k)}(l,k) \tag{21}$$

As noted above, the phase is selected by channel $w_\varphi(l,k)$.

Exemplary embodiments of the invention provide frequency selective signal mixing for enhancing speech signal processing. Speaker Activity Detection (SAD) determines which speaker is active in a fullband manner. Based on the SAD determination, the dominant speaker can be identified for controlling the adjustment of the noise signal characteristics by a dynamic spectral floor. Signal magnitude, power spectral density estimates, and the dynamic spectral floor are frequency-selectively switched between the channels related to the SAD, SNR and absolute level. The phase of the fullband active channel signal can be appended. With this arrangement, only one noise reduction stage is necessary. Multi-channel hands-free operation can be realized with significant reductions in required processing and complexity in comparison with conventional systems.

Figure 10:
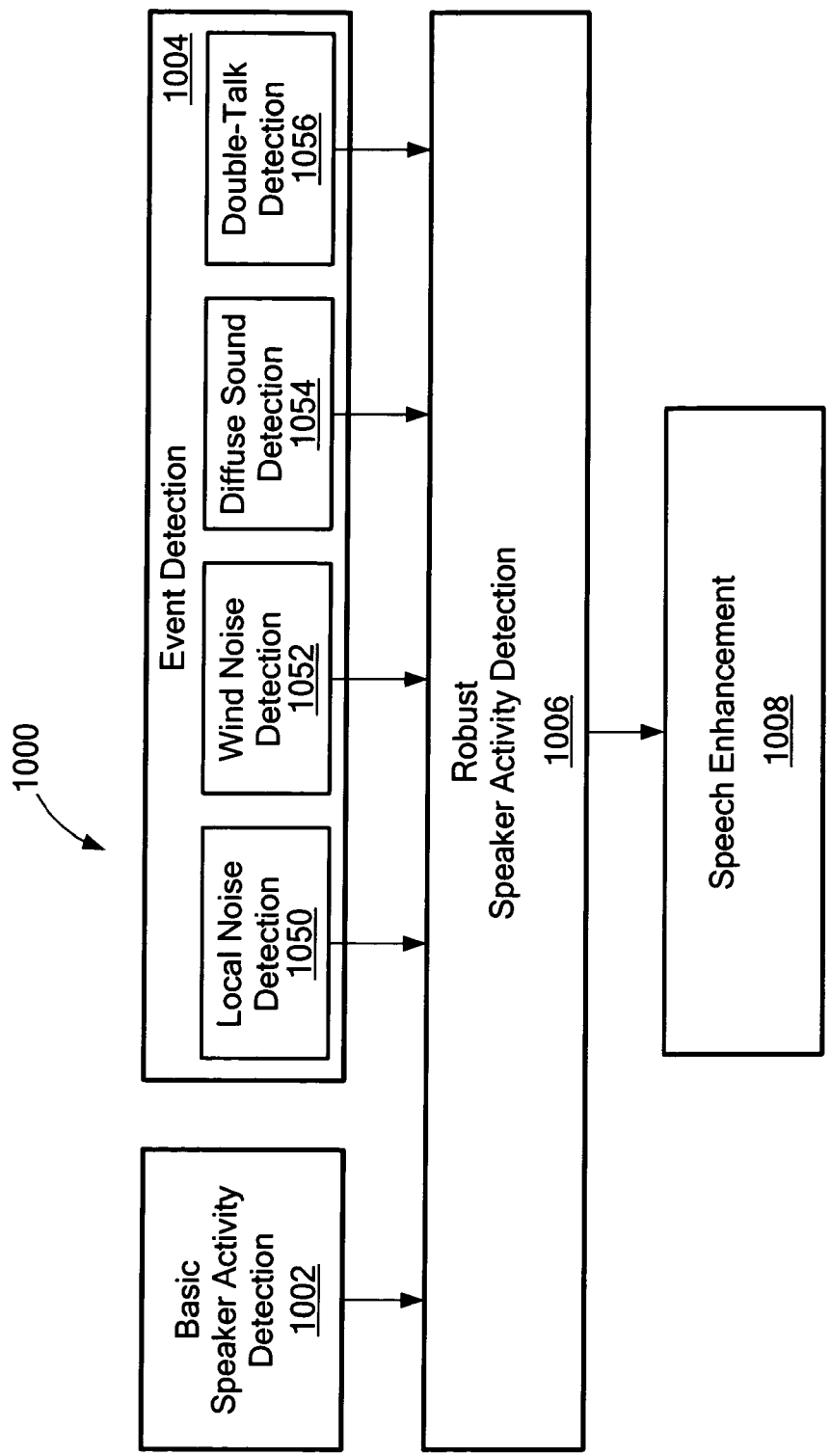
FIG. 10 is a schematic representation of an exemplary robust speaker activity detection system.
Figure 11:
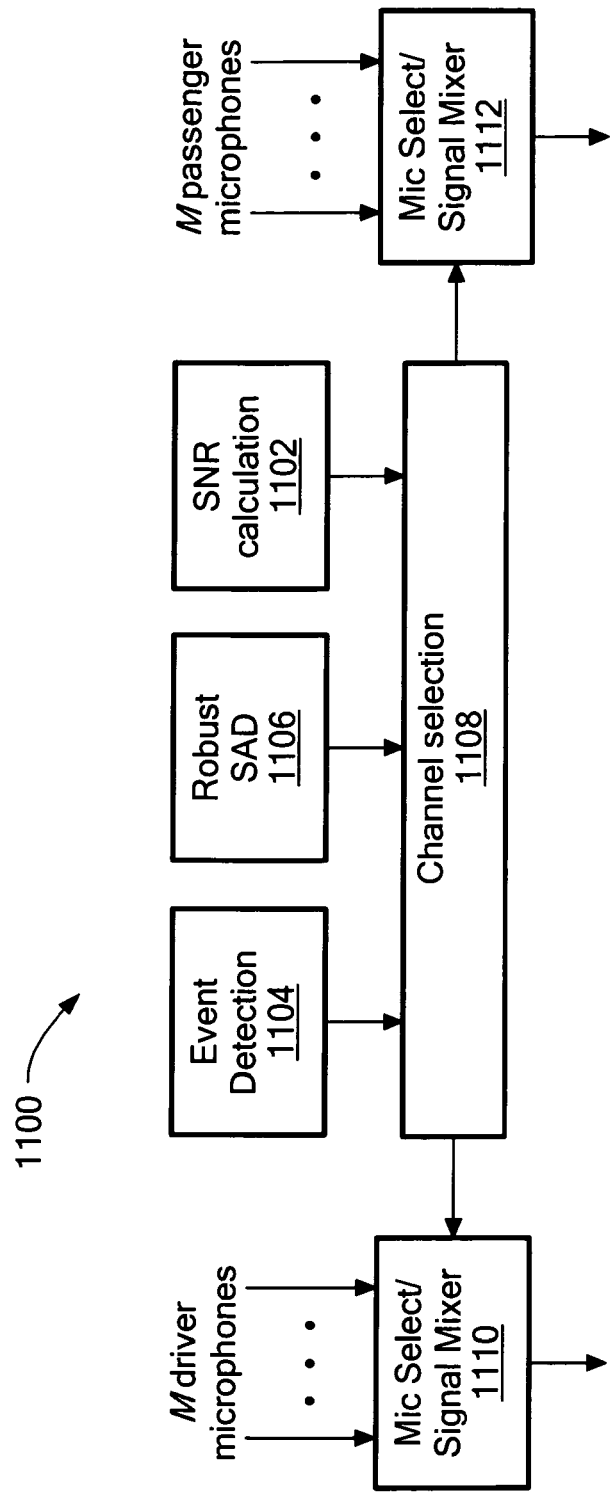
FIG. 11 is a schematic representation of an exemplary channel selection system using robust speaker activity detection.

It is understood that various speaker activity detection embodiments can be used to meet the needs of a particular application. FIGS. 10 and 11 show exemplary speaker activity detection that can be used for the frequency-selective signal mixing embodiments described above.

In exemplary embodiments, an energy-based speaker activity detection (SAD) system evaluates a signal power ratio (SPR) in each of M≥2 microphone channels. In embodiments, the processing is performed in the discrete Fourier transform domain with the frame index l and the frequency subband index k at a sampling rate of $f_s$=16 kHz, for example. In one particular embodiment, the time domain signal is segmented by a Hann window with a frame length of K=512 samples and a frame shift of 25%. It is understood that basic fullband SAD is the focus here and that enhanced fullband SAD and frequency selective SAD are not discussed herein.

Using the microphone signal spectra Y(l,k), the power ratio $\widetilde{SPR}(l,k)$ and the signal-to-noise ratio (SNR) $\hat{\xi}_m(l,k)$ are computed to determine a basic fullband speaker activity detection $\widetilde{SAD}(l)$. As described more fully below, in one embodiment different speakers can be distinguished by analyzing how many positive and negative values occur for the logarithmic SPR in each frame for each channel m, for example.

Before considering the SAD, the system should determine SPRs. Assuming that speech and noise components are uncorrelated and that the microphone signal spectra are a superposition of speech and noise components, the speech signal power spectral density (PSD) estimate $\hat{\Phi}_{\Sigma\Sigma,m}(l,k)$ in channel m can be determined by $$\hat{\Phi}_{\Sigma\Sigma,m}(l,k) = \max\{\hat{\Phi}_{YY,m}(l,k) - \hat{\Phi}_{NN,m}(l,k), 0\}, \tag{22}$$

where $\hat{\Phi}_{YY,m}(l,k)$ may be estimated by temporal smoothing of the squared magnitude of the microphone signal spectra $Y_m(l,k)$. The noise PSD estimate $\hat{\Phi}_{NN,m}(l,k)$ can be determined by any suitable approach such as an improved minimum controlled recursive averaging approach described in I. Cohen, "Noise Spectrum Estimation in Adverse Environments: Improved Minima Controlled Recursive Averaging," *IEEE Transactions on Speech and Audio Processing*, vol. 11, no. 5, pp. 466-475, September 2003, which is incorporated herein by reference. Note that within the measure in Equation (1), direct speech components originating from the speaker related to the considered microphone are included, as well as cross-talk components from other sources and speakers. The SPR in each channel m can be expressed below for a system with M≥2 microphones as $$\widetilde{SPR}_m(\ell, k) = \frac{\max\{\hat{\Phi}_{SS,m}(\ell, k)\epsilon\}}{\max\left\{\max_{\substack{m' \in \{1,\ldots,M\} \\ m' \neq m}}\{\hat{\Phi}_{SS,m'}(\ell, k)\}, \epsilon\right\}} \tag{23}$$

with the small value $\epsilon$, as discussed similarly in T. Matheja, M. Buck, T. Wolff, "Enhanced Speaker Activity Detection for Distributed Microphones by Exploitation of Signal Power Ratio Patterns," in *Proc. IEEE International Conference on Acoustics, Speech, and Signal Processing (ICASSP)*, pp. 2501-2504, Kyoto, Japan, Mar. 2012, which is incorporated herein by reference.

It is assumed that one microphone always captures the speech best because each speaker has a dedicated microphone close to the speaker's position. Thus, the active speaker can be identified by evaluating the SPR values among the available microphones. Furthermore, the logarithmic SPR quantity enhances differences for lower values and results in $$\widetilde{SPR}'_m(l,k) = 10 \log_{10}(\widetilde{SPR}_m(l,k)) \tag{24}$$

Speech activity in the m-th speaker related microphone channel can be detected by evaluating if the occurring logarithmic SPR is larger than 0 dB, in one embodiment. To avoid considering the SPR during periods where the SNR $\xi_m(l,k)$ shows only small values lower than a threshold $\Theta_{SNR1}$, a modified quantity for the logarithmic power ratio in Equation (3) is defined by $$\widetilde{SPR}_m(\ell, k) = \begin{cases} \widetilde{SPR}'_m(\ell, k), & \text{if } \hat{\xi}_m(\ell, k) \geq \Theta_{SNR}, \\ 0, & \text{else.} \end{cases} \tag{25}$$

With a noise estimate $\hat{\Phi}_{NN,m}(l,k)$ for determination of a reliable SNR quantity, the SNR is determined in a suitable manner as in Equation (5) below, such as that disclosed by R. Martin, "An Efficient Algorithm to Estimate the Instantaneous SNR of Speech Signals," in *Proc. European Conference on Speech Communication and Technology (EUROSPEECH)*, Berlin, Germany, pp. 1093-1096, September 1993.

$$\hat{\xi}_m(\ell, k) = \frac{\min\{\hat{\Phi}_{YY,m}(\ell, k), |Y_m(\ell, k)|^2\} - \hat{\Phi}'_{NN,m}(\ell, k)}{\hat{\Phi}'_{NN,m}(\ell, k)}. \tag{26}$$

Using the overestimation factor $\gamma_{SNR}$ the considered noise PSD results in $$\Phi'_{NN,m}(l,k) = \gamma_{SNR} \cdot \Phi_{NN,m}(l,k). \quad (27)$$

Based on Equation (4), the power ratios are evaluated by observing how many positive (+) or negative (−) values occur in each frame. Hence, for the positive counter follows:

$$c_m^+(\ell) = \sum_{k=0}^{K/2} c_m^+(\ell, k), \quad (28)$$

with $$c_m^+(\ell, k) = \begin{cases} 1, & \text{if } \widehat{SPR}_m(\ell, k) < 0, \\ 0, & \text{else.} \end{cases} \quad (29)$$

Equivalently the negative counter can be determined by $$c_m^-(\ell) = \sum_{k=0}^{K/2} c_m^-(\ell, k), \text{ considering} \quad (30)$$

$$c_m^-(\ell, k) = \begin{cases} 1, & \text{if } \widehat{SPR}_m(\ell, k) < 0, \\ 0, & \text{else.} \end{cases} \quad (31)$$

Regarding these quantities, a soft frame-based SAD measure may be written by $$\chi_m^{SAD}(\ell) = G_m^c(\ell) \cdot \frac{c_m^+(\ell) - c_m^-(\ell)}{c_m^+(\ell) + c_m^-(\ell)}, \quad (32)$$

where $G_m^c(l)$ is an SNR-dependent soft weighting function to pay more attention to high SNR periods. In order to consider the SNR within certain frequency regions the weighting function is computed by applying maximum subgroup SNRs:

$$G_m^c(l) = \min\{\hat{\xi}_{max,m}^G(l)/10, 1\}. \quad (33)$$

The maximum SNR across K' different frequency subgroup SNRs $\hat{\xi}_m^G(l,æ)$ is given by $$\hat{\xi}_{max,m}^G(\ell) = \max_{æ \in \{1,\ldots,K'\}} \{\hat{\xi}_m^G(\ell, æ)\}. \quad (34)$$

The grouped SNR values can each be computed in the range between certain DFT bins $k_æ$ and $k_{æ+1}$ with æ=1, 2, . . . , K' and $\{k_æ\}$={4, 28, 53, 78, 103, 128, 153, 178, 203, 228, 253}. We write for the mean SNR in the a-th subgroup:

$$\hat{\xi}_m^G(\ell, æ) = \frac{1}{k_{æ+1} - k_æ} \sum_{k=k_æ+1}^{k_{æ+1}} \hat{\xi}_m(\ell, k) \quad (35)$$

The basic fullband SAD is obtained by thresholding using $\theta_{SAD1}$:

$$\widehat{SAD}_m(\ell) = \begin{cases} 1, & \text{if } \chi_m^{SAD}(\ell) > \Theta_{SAD1}, \\ 0, & \text{else.} \end{cases} \quad (36)$$

It is understood that during double-talk situations the evaluation of the signal power ratios is no longer reliable. Thus, regions of double-talk should be detected in order to reduce speaker activity misdetections. Considering the positive and negative counters, for example, a double-talk measure can be determined by evaluating whether $c_m^+(l)$ exceeds a limit $\theta_{DTM}$ during periods of detected fullband speech activity in multiple channels.

To detect regions of double-talk this result is held for some frames in each channel. In general, double-talk $\widehat{DTD}$ (l)=1 is detected if the measure is true for more than one channel. Preferred parameter settings for the realization of the basic fullband SAD can be found in Table 1 below.

TABLE 1

Parameter settings for exemplary implementation of the basic fullband SAD algorithm (for M = 4)

| $\Theta_{SNR1}$ = 0.25 | $\gamma_{SNR}$ = 4 | K' = 10 |
|---|---|---|
| $\Theta_{SAD1}$ = 0.0025 | $\Theta_{DTM}$ = 30 | |

FIG. 10 shows an exemplary speech signal enhancement system 1000 having a speaker activity detection (SAD) module 1002 and an event detection module 1004 coupled to a robust speaker detection module 1006 that provides information to a speech enhancement module 1008. In one embodiment, the event detection module 1004 includes at least one of a local noise detection module 1050, a wind noise detection module 1052, a diffuse sound detection module 1054, and a double-talk detection module 1056.

The basic speaker activity detection (SAD) module 1002 output is combined with outputs from one or more of the event detection modules 1050, 1052, 1054, 1056 to avoid a possible positive SAD result during interfering sound events. A robust SAD result can be used for further speech enhancement 1008.

It is understood that the term robust SAD refers to a preliminary SAD evaluated against at least one event type so that the event does not result in a false SAD indication, wherein the event types include one or more of local noise, wind noise, diffuse sound, and/or double-talk.

In one embodiment, the local noise detection module 1050 detects local distortions by evaluation of the spectral flatness of the difference between signal powers across the microphones, such as based on the signal power ratio. The spectral flatness measure in channel m for $\tilde{K}$ subbands, can be provided as:

$$\chi_{m,\tilde{K}}^{SF}(\ell) = \frac{\exp\left\{\frac{1}{\tilde{K}} \cdot \sum_{k=0}^{\tilde{K}-1} \log(\max\{\widehat{SPR}_m(\ell, k), \epsilon\})\right\}}{\frac{1}{\tilde{K}} \cdot \sum_{k=0}^{\tilde{K}-1} \max\{\widehat{SPR}_m(\ell, k), \epsilon\}} \quad (37)$$

Temporal smoothing of the spectral flatness with $\gamma_{SF}$ can be provided during speaker activity ($\widehat{SAD}_m(l) > 0$) and decreasing with $\gamma_{dec}^{SF}$ when there is not speaker activity as set forth below:

$$\bar{\chi}_{m,\tilde{K}}^{SF}(\ell) = \begin{cases} \gamma_{SF} \cdot \bar{\chi}_{m,\tilde{K}}^{SF}(\ell-1) + (1-\gamma_{SF}) \cdot \chi_{m,\tilde{K}}^{SF}(\ell), & \text{if } \widehat{SAD}_m(\ell) > 0, \\ \gamma_{dec}^{SF} \cdot \bar{\chi}_{m,\tilde{K}}^{SF}(\ell-1), & \text{else.} \end{cases} \quad (38)$$

In one embodiment, the smoothed spectral flatness can be thresholded to determine whether local noise is detected. Local Noise Detection (LND) in channel m with $\tilde{K}$: whole frequency range and threshold $\theta LND$ can be expressed as follows:

$$LND_m(\ell) = \begin{cases} 1, & \text{if } \overline{\chi}_{m,\tilde{K}}^{SF}(\ell) > \Theta_{LND}, \\ 0, & \text{else.} \end{cases} \quad (39)$$

In one embodiment, the wind noise detection module 1050 thresholds the smoothed spectral flatness using a selected maximum frequency for wind. Wind noise detection (WND) in channel m with $\tilde{K}$ being the number of subbands up to, e.g., 2000 Hz and the threshold $\theta_{WND}$ can be expressed as:

$$WND_m(\ell) = \begin{cases} 1, & \text{if } \left(\overline{\chi}_{m,\tilde{K}}^{SF}(\ell) > \Theta_{WND}\right) \wedge (LND_m(\ell) < 1), \\ 0, & \text{else.} \end{cases} \quad (40)$$

It is understood that the maximum frequency, number of subbands, smoothing parameters, etc., can be varied to meet the needs of a particular application. It is further understood that other suitable wind detection techniques known to one of ordinary skill in the art can be used to detect wind noise.

In an exemplary embodiment, the diffuse sound detection module 354 indicates regions where diffuse sound sources may be active that might harm the speaker activity detection. Diffuse sounds are detected if the power across the microphones is similar. The diffuse sound detection module is based on the speaker activity detection measure $\chi_m^{SAD}(l)$ (see Equation (32)). To detect diffuse events a certain positive threshold has to be exceeded by this measure in all of the available channels, whereas $\chi_m^{SAD}(l)$ has to be always lower than a second higher threshold.

In one embodiment, the double-talk module 356 estimates the maximum speaker activity detection measure based on the speaker activity detection measure $\chi_m^{SAD}(l)$ set forth in Equation (33) above, with an increasing constant $\gamma_{inc}^{\chi}$ applied during fullband speaker activity if the current maximum is smaller than the currently observed SAD measure. The decreasing constant $\gamma_{dec}^{\chi}$ is applied otherwise, as set forth below.

$$\hat{\chi}_{max,m}^{SAD}(\ell) = \quad (41)$$
$$\begin{cases} \hat{\chi}_{max,m}^{SAD}(\ell-1) + \gamma_{inc}^{\chi}, & \text{if } \left(\hat{\chi}_{max,m}^{SAD}(\ell-1) < \chi_m^{SAD}(\ell)\right) \wedge \left(\widetilde{SAD}_m(\ell) > 0\right), \\ \max\{\hat{\chi}_{max,m}^{SAD}(\ell-1) - \gamma_{dec}^{\chi}, -1\}, & \text{else.} \end{cases}$$

Temporal smoothing of the speaker activity measure maximum can be provided with $\gamma_{SAD}$ as follows:

$$\overline{\chi}_{max,m}^{SAD}(l) = \gamma_{SAD} \cdot \overline{\chi}_{max,m}^{SAD}(l-1) + (1-\gamma_{SAD}) \cdot \hat{\chi}_{max,m}^{SAD}(l). \quad (42)$$

Double talk detection (DTD) is indicated if more than one channel shows a smoothed maximum measure of speaker activity larger than a threshold $\theta_{DTD}$, as follows:

$$DTD(\ell) = \begin{cases} 1, & \text{if } \left(\left(\sum_{m=1}^{M} f(\overline{\chi}_{max,m}^{SAD}(\ell), \Theta_{DTD})\right) > 1\right), \\ 0, & \text{else.} \end{cases} \quad (43)$$

Here the function $f(x,y)$ performs threshold decision:

$$f(x,y) = \begin{cases} 1, & \text{if } x > y, \\ 0, & \text{else.} \end{cases} \quad (44)$$

With the constant $\gamma_{DTD} \in \{0, \ldots, 1\}$ we get a measure for detection of double-talk regions modified by an evaluation of whether double-talk has been detected for one frame:

$$\overline{\chi}^{DTD}(\ell) = \begin{cases} \gamma_{DTD} \cdot \overline{\chi}^{DTD}(\ell-1) + (1-\gamma_{DTD}), & \text{if } DTD(\ell) > 0, \\ \gamma_{DTD} \cdot \overline{\chi}^{DTD}(\ell-1), & \text{else.} \end{cases} \quad (45)$$

The detection of double-talk regions is followed by comparison with a threshold:

$$\widetilde{DTD}(\ell) = \begin{cases} 1, & \text{if } \overline{\chi}^{DTD}(\ell) > \Theta_{\widetilde{DTD}}, \\ 0, & \text{else.} \end{cases} \quad (46)$$

FIG. 11 shows an exemplary microphone selection system 1100 to select a microphone channel using information from a SNR module 1102, an event detection module 1104, which can be similar to the event detection module 1004 of FIG. 10, and a robust SAD module 1106, which can be similar to the robust SAD module 1006 of FIG. 10, all of which are coupled to a channel selection module 1108. A first microphone select/signal mixer 1110, which receives input from M driver microphones, for example, is coupled to the channel selection module 1108. Similarly, a second microphone select/signal mixer 1112, which receives input from M passenger microphones, for example, is coupled to the channel selection module 1108. As described more fully below, the channel selection module 1108 selects the microphone channel prior to any signal enhancement processing. Alternatively, an intelligent signal mixer combines the input channels to an enhanced output signal. By selecting the microphone channel prior to signal enhancement, significant processing resources are saved in comparison with signal processing of all the microphone channels.

When a speaker is active, the SNR calculation module 1102 can estimate SNRs for related microphones. The channel selection module 1108 receives information from the event detection module 1104, the robust SAD module 1106 and the SNR module 1102. If the event of local disturbances is detected locally on a single microphone, that microphone should be excluded from the selection. If there is no local distortion, the signal with the best SNR should be selected. In general, for this decision, the speaker should have been active.

In one embodiment, the two selected signals, one driver microphone and one passenger microphone can be passed to a further signal processing module (not shown), that can include noise suppression for hands free telephony of speech recognition, for example.

Since not all channels need to be processed by the signal enhancement module, the amount of processing resources required is significantly reduced.

In one embodiment adapted for a convertible car with two passengers with in-car communication system, speech communication between driver and passenger is supported by picking up the speaker's voice over microphones on the seat belt or other structure, and playing the speaker's voice back over loudspeakers close to the other passenger. If a microphone is hidden or distorted, another microphone on the belt can be selected. For each of the driver and passenger, only the 'best' microphone will be further processed.

Alternative embodiments can use a variety of ways to detect events and speaker activity in environments having multiple microphones per speaker. In one embodiment, signal powers/spectra Oss can be compared pairwise, e.g., symmetric microphone arrangements for two speakers in a car with three microphones on each seat belts, for example. The top microphone m for the driver Dr can be compared to the top microphone of the passenger Pa, and similarly for the middle microphones and the lower microphones, as set forth below:

$$\Phi_{SS,Dr,m}(\ell,k) \leftrightarrow \Phi_{SS,Pa,m}(\ell,k) \quad (47)$$

Events, such as wind noise or body noise, can be detected for each group of speaker-dedicated microphones individually. The speaker activity detection, however, uses both groups of microphones, excluding microphones that are distorted.

In one embodiment, a signal power ratio (SPR) for the microphones is used:

$$SPR_m(\ell, k) = \frac{\Phi_{SS,m}(\ell, k)}{\Phi_{SS,m'}(\ell, k)} \quad (48)$$

Equivalently, comparisons using a coupling factor K that maps the power of one microphone to the expected power of another microphone can be used, as set forth below:

$$\Phi_{SS,m}(\ell,k) \cdot K_{m,m'}(\ell,k) \leftrightarrow \Phi_{SS,m'}(\ell,k) \quad (49)$$

The expected power can be used to detect wind noise, such as if the actual power exceeds the expected power considerably. For speech activity of the passengers, specific coupling factors can be observed and evaluated, such as the coupling factors K above. The power ratios of different microphones are coupled in case of a speaker, where this coupling is not given in case of local distortions, e.g. wind or scratch noise.

Figure 12:
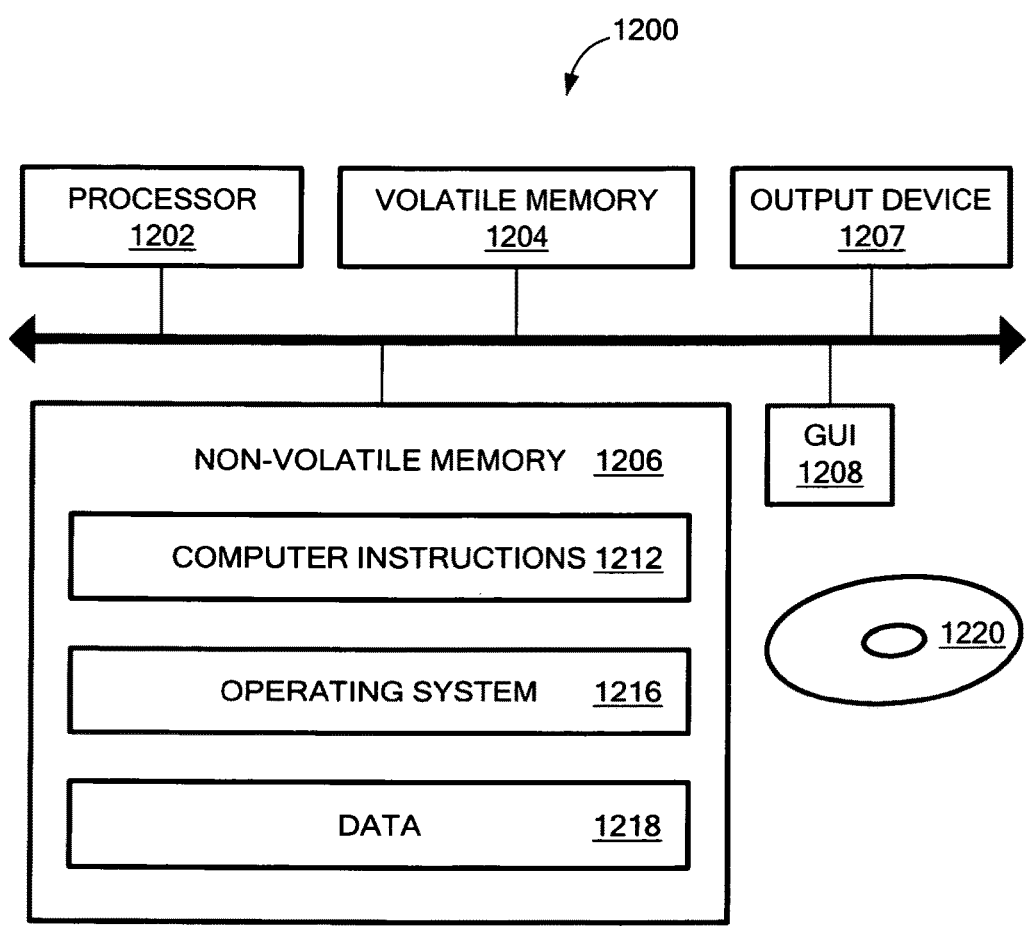
FIG. 12 is a schematic representation of an exemplary computer that can perform at least a portion of the processing describe herein.

FIG. 12 shows an exemplary computer 1200 that can perform at least part of the processing described herein. The computer 1200 includes a processor 1202, a volatile memory 1204, a non-volatile memory 1206 (e.g., hard disk), an output device 1207 and a graphical user interface (GUI) 1208 (e.g., a mouse, a keyboard, a display, for example). The non-volatile memory 1206 stores computer instructions 1212, an operating system 1216 and data 1218. In one example, the computer instructions 1212 are executed by the processor 1202 out of volatile memory 1204. In one embodiment, an article 1220 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. A method, comprising:
   receiving a plurality of microphone signals;
   for each channel in the microphone signals, transforming the microphone signals into the frequency subband domain;
   performing frequency-based channel selection using speaker activity detection information for mixing, by a mixer, signal spectra, signal power, and/or noise power of the channels;
   using noise power spectral density estimates and speaker dominance information to generate attenuation vectors; and
   performing noise reduction on output signals of the mixer by using an attenuation vector selected from the generated attenuation vectors.

2. The method according to claim 1, further including performing the frequency-based channel selection for a dynamic spectral floor to adjust a noise estimate for the noise reduction using speaker dominance information.

3. The method according to claim 1, further including mixing phase information with the selected signal channel.

4. The method according to claim 1, further including selecting the channel having the maximum signal-to-noise ratio of the microphone signals for each subband.

5. The method according to claim 1, further including selecting the channel having the highest signal energy of the microphone signals for each subband.

6. The method according to claim 1, further including performing the frequency-based channel selection for signal amplitude and selecting phase of an active speaker signal based on the speaker activity detection information.

7. The method according to claim 1, further including performing the noise reduction using filter coefficients that are limited by a channel-independent frequency-selected spectral floor.

8. The method according to claim 1, further including computing dynamic spectral floors from speaker dominance weights of background noise for an active speaker and a previously active speaker.

9. An apparatus, comprising:
a non-transitory computer-readable medium having stored instructions that enable a machine to:
receive a plurality of microphone signals;
for each channel in the microphone signals, transform the microphone signals into the frequency subband domain;
perform frequency-based channel selection using speaker activity detection information for mixing, by a mixer, signal spectra, signal power, and/or noise power of the channels;
use noise power spectral density estimates and speaker dominance information to generate attenuation vectors; and
perform noise reduction on the output signals of the mixer by using an attenuation vector selected from the generated attenuation vectors.

10. The apparatus according to claim 9 further including performing the frequency-based channel selection for a dynamic spectral floor to adjust a noise estimate using speaker dominance information.

11. The apparatus according to claim 9, further including instructions to mix phase information with the selected signal channel.

12. The apparatus according to claim 9, further including instructions to select the channel having the maximum signal-to-noise ratio of the microphone signals for each subband.

13. The apparatus according to claim 9, further including instructions to select the channel having the highest signal energy of the microphone signals for each subband.

14. The apparatus according to claim 9, further including instructions to perform the frequency-based channel selection for signal amplitude and selecting phase of an active speaker signal based on the speaker activity detection information.

15. The apparatus according to claim 9, further including instructions to perform the noise reduction using filter coefficients that are limited by a channel-independent frequency- selected spectral floor.

16. The apparatus according to claim 9, further including instructions to compute dynamic spectral floors from the speaker dominance weights of background noise for the active speaker and a previously active speaker.

17. A system, comprising:
a processor; and
a memory that contains instructions that are readable by the processor to cause the processor to perform operations of:
a receiver to receive a plurality of microphone signals;
a speaker activity detector to transform the microphone signals into the frequency subband domain for each channel in the microphone signals;
a selective signal selector to perform frequency-based channel selection using speaker activity detection information for mixing signal spectra, signal power, and/or noise power of the channels;
a noise power spectral density evaluator to generate attenuation vectors using noise power spectral density estimates and speaker dominance information; and
a noise reducer to reduce noise on the mixed signal spectra, signal power, and/or noise power signals for generating a noise-reduced output signal by using an attenuation vector selected from the generated attenuation vectors.

18. The system according to claim 17, wherein the system performs the frequency-based channel selection for a dynamic spectral floor to adjust a noise estimate using speaker dominance information.

19. The system according to claim 17, wherein the selective signal selector selects the channel having the maximum signal-to-noise ratio of the microphone signals for each subband.

20. The system according to claim 17, wherein the noise reducer performs the noise reduction using filter coefficients that are limited by a channel-independent frequency-selected spectral floor.

* * * * *